(12) United States Patent
Akagawa et al.

(10) Patent No.: US 7,793,412 B2
(45) Date of Patent: Sep. 14, 2010

(54) COMPONENT-EMBEDDED BOARD FABRICATION METHOD

(75) Inventors: Masatoshi Akagawa, Nagano (JP); Kazunari Sekigawa, Nagano (JP); Shinichi Wakabayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 432 days.

(21) Appl. No.: 10/612,222

(22) Filed: Jul. 3, 2003

(65) Prior Publication Data

US 2004/0049912 A1 Mar. 18, 2004

(30) Foreign Application Priority Data

Jul. 9, 2002 (JP) .............................. 2002-200055
Dec. 4, 2002 (JP) .............................. 2002-352440

(51) Int. Cl.
 *H05K 3/30* (2006.01)
(52) U.S. Cl. .............................. 29/833; 29/714; 29/720; 29/825; 29/830; 29/846; 250/559.44; 250/559.45; 250/559.46; 356/237.1; 356/394; 382/147; 382/149; 382/151; 702/35; 702/81; 702/82
(58) Field of Classification Search .................. 29/739, 29/740, 832, 825, 720, 830, 833, 846, 852, 29/714; 356/394, 237; 358/101, 145; 702/35, 702/81–84; 382/147, 149, 151; 250/559.44, 250/559.45, 559.46; 430/30
See application file for complete search history.

(56) References Cited

U.S. PATENT DOCUMENTS

| | | | |
|---|---|---|---|
| 5,103,557 A * | 4/1992 | Leedy .............................. 438/6 |
| 5,386,623 A | 2/1995 | Okamoto et al. |
| 5,991,699 A * | 11/1999 | Kulkarni et al. ............... 702/83 |
| 6,165,658 A * | 12/2000 | Taff et al. ..................... 430/30 |
| 6,171,946 B1 | 1/2001 | Tsukamoto |
| 2001/0004130 A1 | 6/2001 | Higashi et al. |
| 2001/0008794 A1 | 7/2001 | Akagawa |
| 2002/0146859 A1 | 10/2002 | Akagawa |
| 2004/0168825 A1 | 9/2004 | Sakamoto et al. |

FOREIGN PATENT DOCUMENTS

| | | |
|---|---|---|
| EP | 0 273 703 | 12/1987 |
| EP | 0 471 122 | 8/1990 |
| JP | 4-72656 | 3/1992 |

(Continued)

OTHER PUBLICATIONS

Communication mailed from the Japanese Patent Office on Apr. 22, 2008 in the related Japanese patent application.

(Continued)

*Primary Examiner*—Rick K Chang
(74) *Attorney, Agent, or Firm*—Staas & Halsey LLP

(57) ABSTRACT

A component-embedded board fabrication method includes detecting, before the board is covered with a first insulating layer, the actual position of a first electronic component formed on a surface of the board, calculating a displacement between the design position of the first electronic component on the surface of the board and holding the displacement as first displacement data, and correcting, based on the first displacement data, design data to be used for processing the board after the board is covered with the first insulating layer.

32 Claims, 18 Drawing Sheets

FOREIGN PATENT DOCUMENTS

| | | |
|---|---|---|
| JP | 10-41634 | 2/1998 |
| JP | 11-163499 | 6/1999 |
| JP | 2002-323645 | 11/2000 |
| JP | 2001-44601 | 2/2001 |
| JP | 2001-160677 | 6/2001 |
| JP | 2001-177045 | 6/2001 |
| JP | 2001-196525 | 7/2001 |
| JP | 2001-332863 | 11/2001 |
| WO | WO 00/77854 | 12/2000 |

OTHER PUBLICATIONS

Office Action for Japanese Patent Application. No. 2002-352440 mailed by the Japanese Patent Office on Aug. 21, 2007, 2 pages.

U.S. Appl. No. 12/004,431, filed Dec. 21, 2007, Masatoshi Akagawa et al., Shinko Electric Industries Co., Ltd.

Communication dated Jan. 9, 2009 from the Taiwanese (Chinese Taipei) Intellectual Property Office in the related Taiwanese patent application.

* cited by examiner

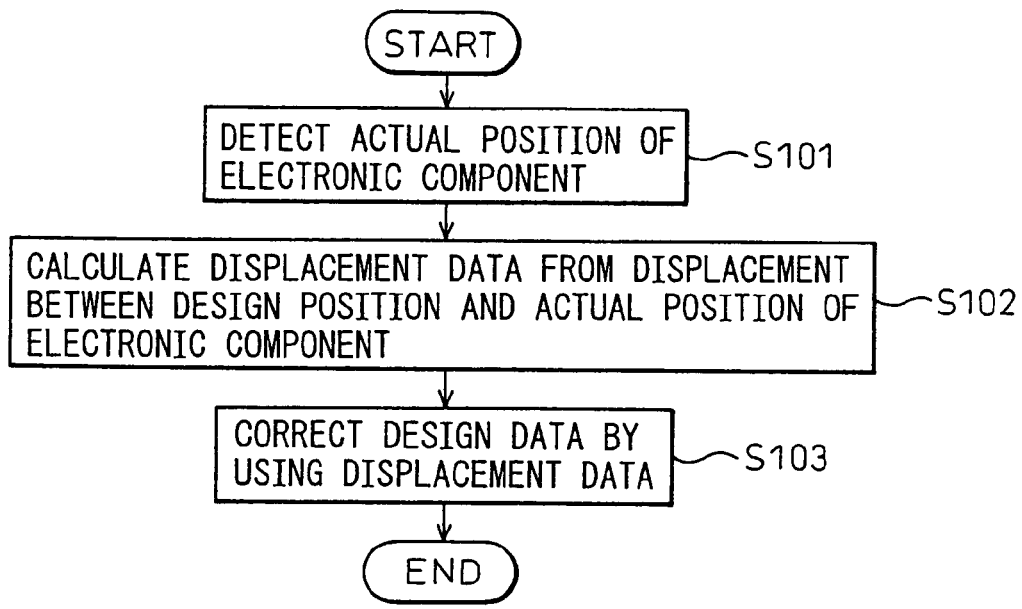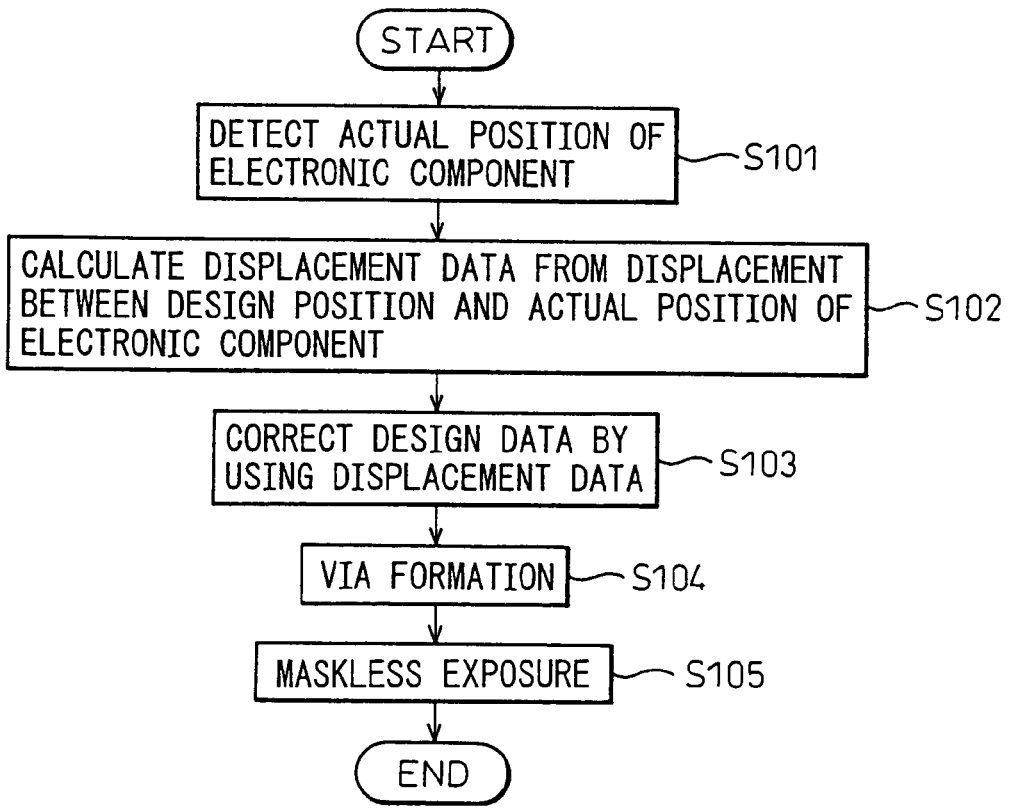

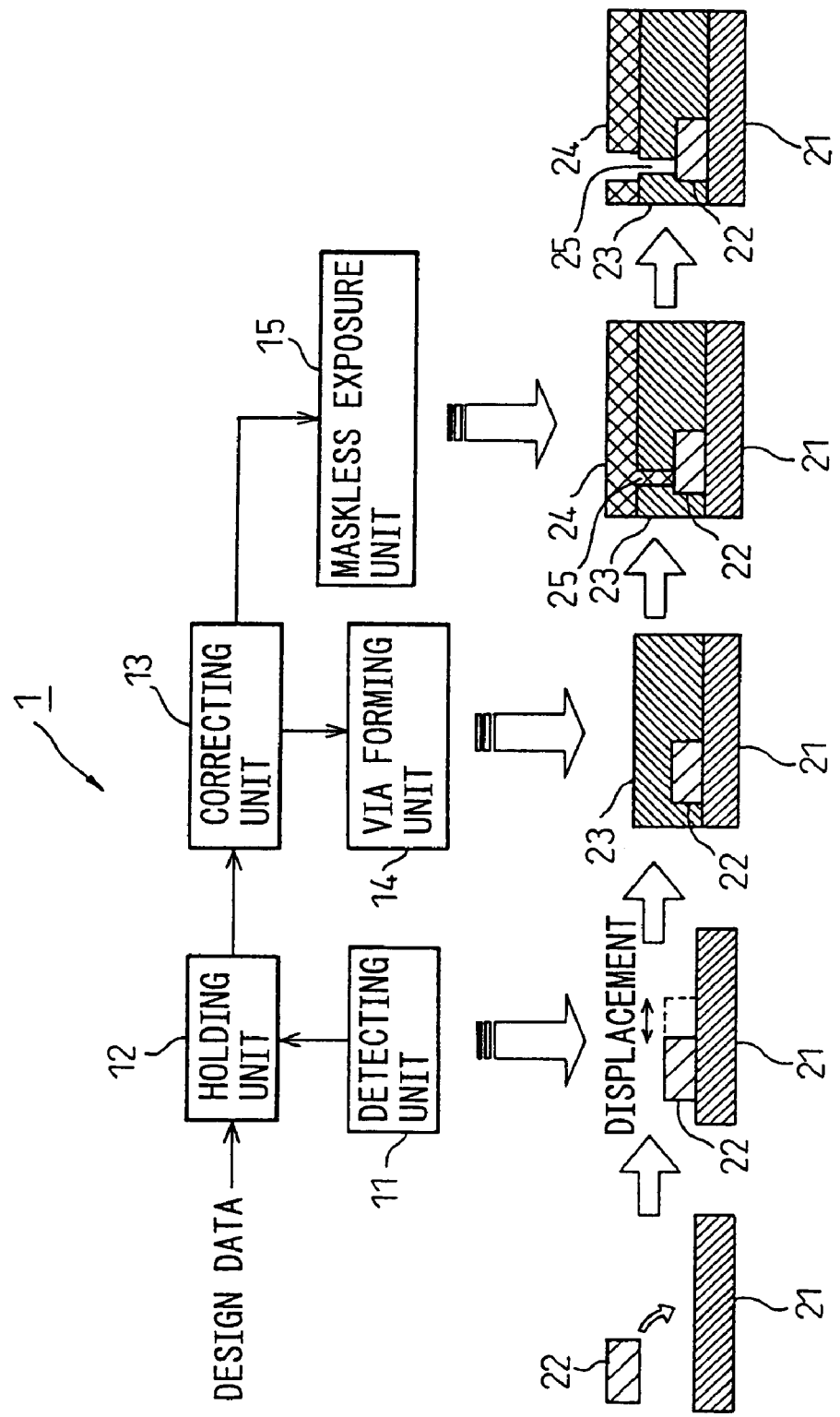

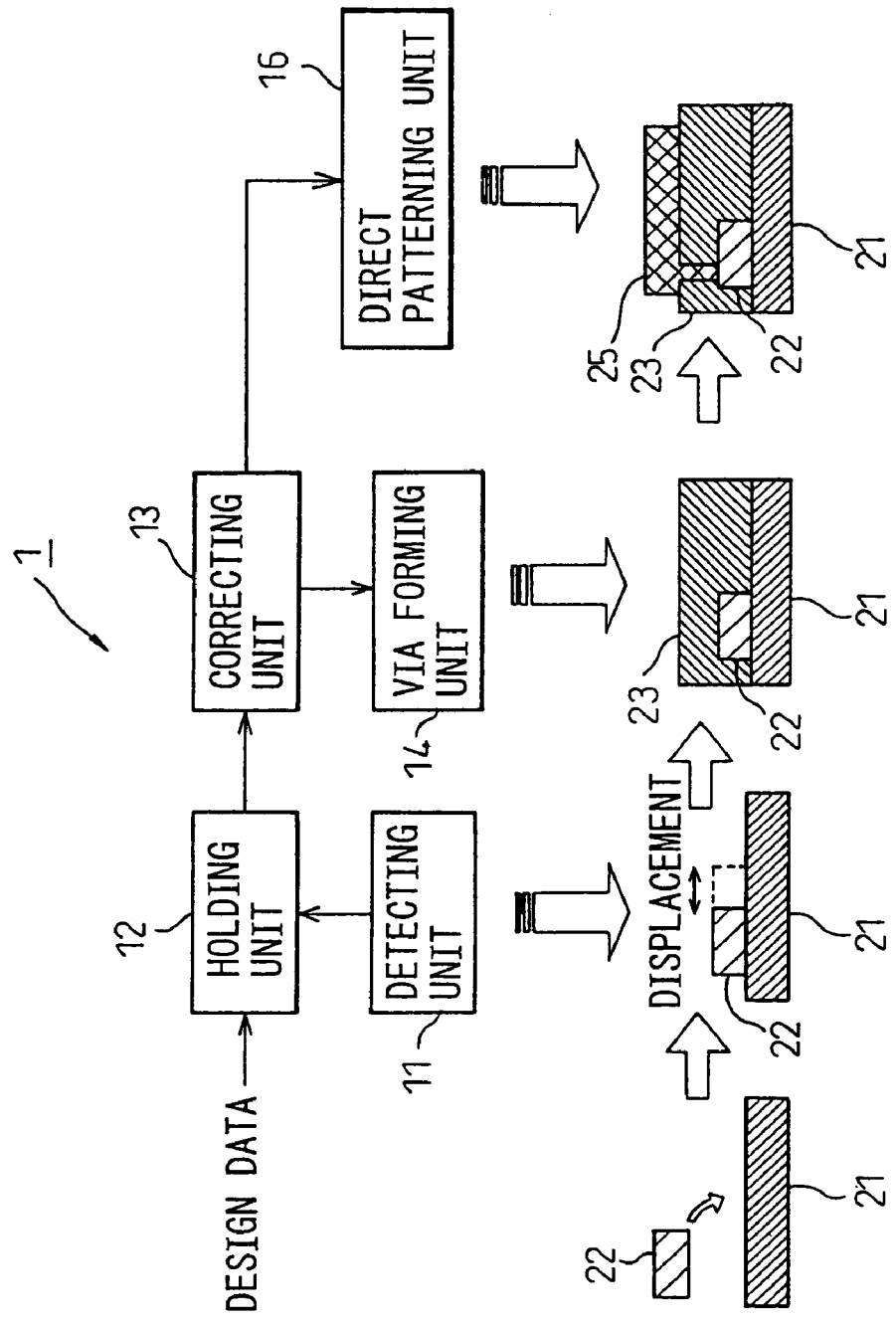

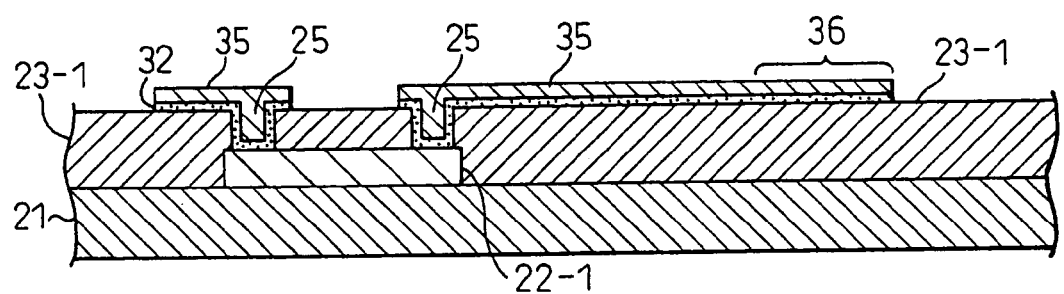
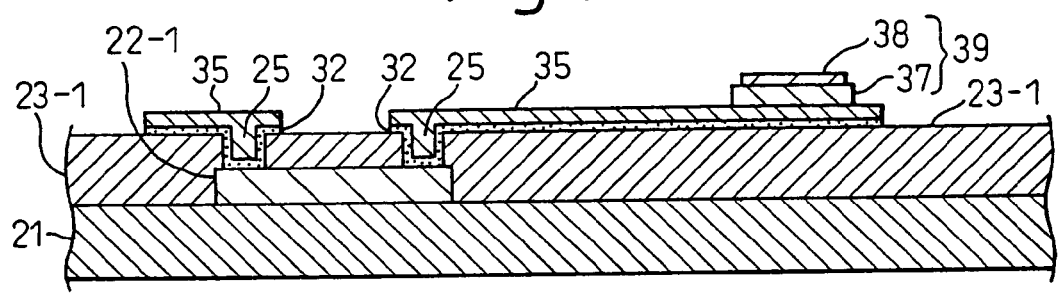

DESIGN POSITION= MASK POSITION

DISPLACED POSITION
· ANGULAR DISPLACEMENT $\theta$
· HORIZONTAL DISPLACEMENT ($\Delta X$, $\Delta Y$)

COMPONENT-EMBEDDED BOARD FABRICATION METHOD

BACKGROUND OF THE INVENTION

1. Field of the Invention

The present invention relates to a component-embedded board fabrication method for fabricating a component-embedded board with electronic components embedded in a wiring board, and an apparatus using the same.

2. Description of the Related Art

With the increasing miniaturization and complexity of wiring patterns formed on printed circuit boards, a need is increasing for high-precision wiring forming technologies. On the other hand, as electronic apparatuses shrink in size and increase in performance, multilayered wiring boards are increasingly used. In some wiring boards (hereinafter called "component-embedded boards"), various kinds of electronic components, such as IC chips, semiconductor devices, capacitors, resistors, etc., are embedded, or electronic components such as capacitors, resistors, inductors, etc. are fabricated in integral fashion in the board.

In the case of a single-layered component-embedded board, various electronic components must be arranged in two dimensions, but in the case of a multilayered component-embedded board, electronic components can be arranged efficiently in three dimensions by placing one layer of components above another layer of components. As the wiring length can be reduced compared with the case of a single-layer board, the multilayered structure can achieve a wiring board that is resistant to noise and stray capacitance and that can be used in high-frequency applications.

Generally, a wiring board is fabricated by exposing the board in a desired pattern based on wiring pattern design data, and by developing the desired pattern to print the pattern on it, followed by etching.

Specifically, when fabricating a multilayered component-embedded board, high precision is particularly demanded in the formation of wiring on the multilayered board because not only is the formation of electronic components and the physical formation of multiple layers consisting of insulating layers and wiring layers required, but the interconnection wiring between the wiring layers is also required.

For example, in conventional photolithography using a photomask, when forming an electronic component in a certain layer, the electronic component must be formed by precisely positioning it with respect to the board; otherwise, the via and wiring formed in the subsequent exposure process would be displaced from the connecting terminal of the electronic component.

FIG. 19 is a diagram illustrating the patterning and the resulting positional displacement in a prior art example using a photomask.

In the patterning of the prior art example using a photomask, the mask position and the mask pattern are decided based on design data. However, when forming an electronic component, if the electronic component is not formed by precisely positioning it with respect to the board, an angular displacement θ and horizontal displacements Δx and Δy occur between the mask position and the position where the electronic component is formed.

FIG. 20 is a diagram illustrating the positional relationship between the electronic component and a wiring line projected on the component-embedded board through the photomask. In FIG. 20, the design position 101 of the connecting terminal of the electronic component, that is, the position where the connecting terminal of the electronic component should normally be located, is indicated by a dashed line.

If the electronic component was actually formed in the position indicated by a solid line 102 and was thus displaced from the design position on the wiring board and if the wiring line 103 is formed in accordance with the prior art exposure process using a photomask, a positional displacement would occur between the wiring line and the electronic component.

One possible way to avoid such a positional displacement would be to form the electronic component as faithfully to the design data as possible, but it would be extremely costly to implement such a high-precision fabrication process.

Furthermore, once the board with the electronic component formed thereon is covered with an insulating layer, it is difficult to locate the position of the electronic component. Accordingly, even if a displacement or distortion is caused in the formation of the electronic component, the subsequent processes have to be performed in accordance with the design data, eventually ending up in the production of a defective part.

As described, in the prior art, it is difficult to locate the position of the electronic component once it is covered with an insulating layer; as a result, with increasing number of layers in the board and with increasing miniaturization of the wiring pattern, it becomes increasingly difficult to fabricate a defect-free circuit board.

In view of the above problem, it is an object of the present invention to provide a component-embedded board fabrication method for high-precision and easy fabrication of a component-embedded board with electronic components embedded in a wiring board, and an apparatus for the same.

SUMMARY OF THE INVENTION

To achieve the above object, in accordance with the component-embedded board fabrication method of the invention for fabricating a component-embedded board with electronic components embedded in a wiring board, the displacement of the position of each electronic component formed on each individual board is detected relative to the design position of the electronic component before it is covered with an insulating layer. Next, design data to be used for processing the board after it is covered with the insulating layer is dynamically corrected using the thus detected displacement. Then, based on the corrected data, a wiring pattern and a via are formed using maskless exposure or inkjet technology.

FIG. 1 is a flowchart (part 1) illustrating the component-embedded board fabrication method of the present invention.

The component-embedded board fabrication method of the present invention comprises: a first detection step S101 for detecting, before the board is covered with a first insulating layer, the actual position of a first electronic component formed on a surface of the board; a first holding step S102 for calculating a displacement between the design position of the first electronic component and the actual position of the first electronic component on the surface of the board, and for holding the displacement as first displacement data; and a first correction step S103 for correcting, based on the first displacement data, design data to be used for processing the board after the board is covered with the first insulating layer.

Here, the first detection step S101 may be replaced by a step for capturing, before the board is covered with the first insulating layer, an image of the surface of the board on which the first electronic component is formed. In this case, the first holding step calculates the displacement between the design position of the first electronic component and the actual position of the first electronic component detected from first image data obtained by imaging the surface of the board, and holds the displacement as the first displacement data.

FIG. 2 is a flowchart (part 2) illustrating the component-embedded board fabrication method of the present invention.

The corrected design data obtained from step S103 is used in various processing steps, for example, a via formation step and a maskless exposure step, to be performed on the board after the board is covered with the insulating layer.

As shown in FIG. 2, the component-embedded board fabrication method of the present invention may further comprise a first via formation step S104 for forming, based on the design data corrected in the first correction step S103, a via hole in the board covered with the first insulating layer, and a first maskless exposure step S105 for applying, based on the design data corrected in the first correction step S103, a maskless exposure to the board covered with the first insulating layer.

A multilayered component-embedded board can be fabricated by repeating the above process.

FIG. 3 is a flowchart (part 3) illustrating the component-embedded board fabrication method of the present invention.

The corrected design data obtained from step S103 may be used when directly forming a wiring pattern by using inkjet technology.

That is, as shown in FIG. 3, the component-embedded board fabrication method of the present invention may further comprises a first via formation step S104 for forming, based on the design data corrected in the first correction step S103, a via hole in the board covered with the first insulating layer, and a first direct patterning step S106 for forming, based on the design data corrected in the first correction step S103, a wiring pattern by inkjetting onto the board covered with the first insulating layer.

A multilayered component-embedded board can be fabricated by repeating the above process.

FIG. 4 is a system block diagram (part 1) illustrating the component-embedded board fabrication apparatus of the present invention.

The component-embedded board fabrication apparatus 1 of the present invention comprises: detecting unit 11 for detecting, before the board 21 is covered with an insulating layer 23, the actual position of an electronic component 22 formed on a surface of the board 21; holding unit 12 for calculating a displacement between the design position of the electronic component 22 and the actual position of the electronic component 22 on the surface of the board 21, and for holding the displacement as displacement data; and correcting unit 13 for correcting, based on the displacement data, design data to be used for processing the board 21 after the board 21 is covered with the insulating layer 23.

Here, the detecting unit 11 may be replaced by imaging means for capturing, before the board 23 is covered with the insulating layer 23, an image of the surface of the board 21 on which the electronic component 22 is formed. In this case, the holding unit 12 calculates the displacement between the design position of the electronic component 22 and the actual position of the electronic component 22 detected from image data obtained by imaging the surface of the board 21, and holds the displacement as the displacement data.

Preferably, the component-embedded board fabrication apparatus 1 of the present invention further comprises via forming unit 14 for forming, based on the design data corrected by the correcting unit 13, a via hole 25 in the board covered with the insulating layer 23. After the via hole 25 is formed, a photoresist layer 24 for wiring pattern formation is formed.

Also, preferably, the component-embedded board fabrication apparatus 1 of the present invention further comprises maskless exposure unit 15 for applying, based on the design data corrected by the correcting unit 13, a maskless exposure to the board covered with the insulating layer 23.

FIG. 5 is a system block diagram (part 2) illustrating the component-embedded board fabrication apparatus of the present invention.

The component-embedded board fabrication apparatus 1 of the present invention may include, in place of the maskless exposure unit 15 shown in FIG. 4, direct patterning unit 16 for forming, based on the design data corrected by the correcting unit 13, a wiring pattern by inkjetting on the board covered with the insulating layer 23.

According to the present invention, when fabricating a component-embedded board, if an electronic component formed on the board is displaced from the design position thereof, the design data to be used in the subsequent processing of the board is corrected by taking the displacement into account, and the wiring pattern formation and the via formation using the maskless exposure or inkjet technology are performed based on the corrected design data; as a result, the component-embedded board can be fabricated easily, even if the electronic component is somewhat displaced in position, and the fabrication yield improves drastically compared with the prior art that uses a photomask.

Furthermore, the present invention can easily cope with a situation where, during the trial production of the component-embedded board, for example, an urgent change has to be made to the circuit configuration without changing the design drawing itself.

BRIEF DESCRIPTION OF THE DRAWINGS

The present invention will be more clearly understood from the description as set below with reference to the accompanying drawings, wherein:

FIG. 1 is a flowchart (part 1) illustrating a component-embedded board fabrication method according to the present invention;

FIG. 2 is a flowchart (part 2) illustrating a component-embedded board fabrication method according to the present invention;

FIG. 4 is a system block diagram (part 1) illustrating a component-embedded board fabrication apparatus according to the present invention;

FIG. 5 is a system block diagram (part 2) illustrating a component-embedded board fabrication apparatus according to the present invention;

FIGS. 9a and 9b are diagrams illustrating an example of how a capacitor to be embedded in an insulating layer is formed according to the first embodiment of the component-embedded board fabrication method of the present invention;

DESCRIPTION OF THE PREFERRED EMBODIMENTS

First, a description will be given of a first embodiment of the present invention applied to the fabrication of a multilayered component-embedded board.

FIGS. 6a to 11b are diagrams for explaining the first embodiment of the component-embedded board fabrication method according to the present invention.

Figure 3:
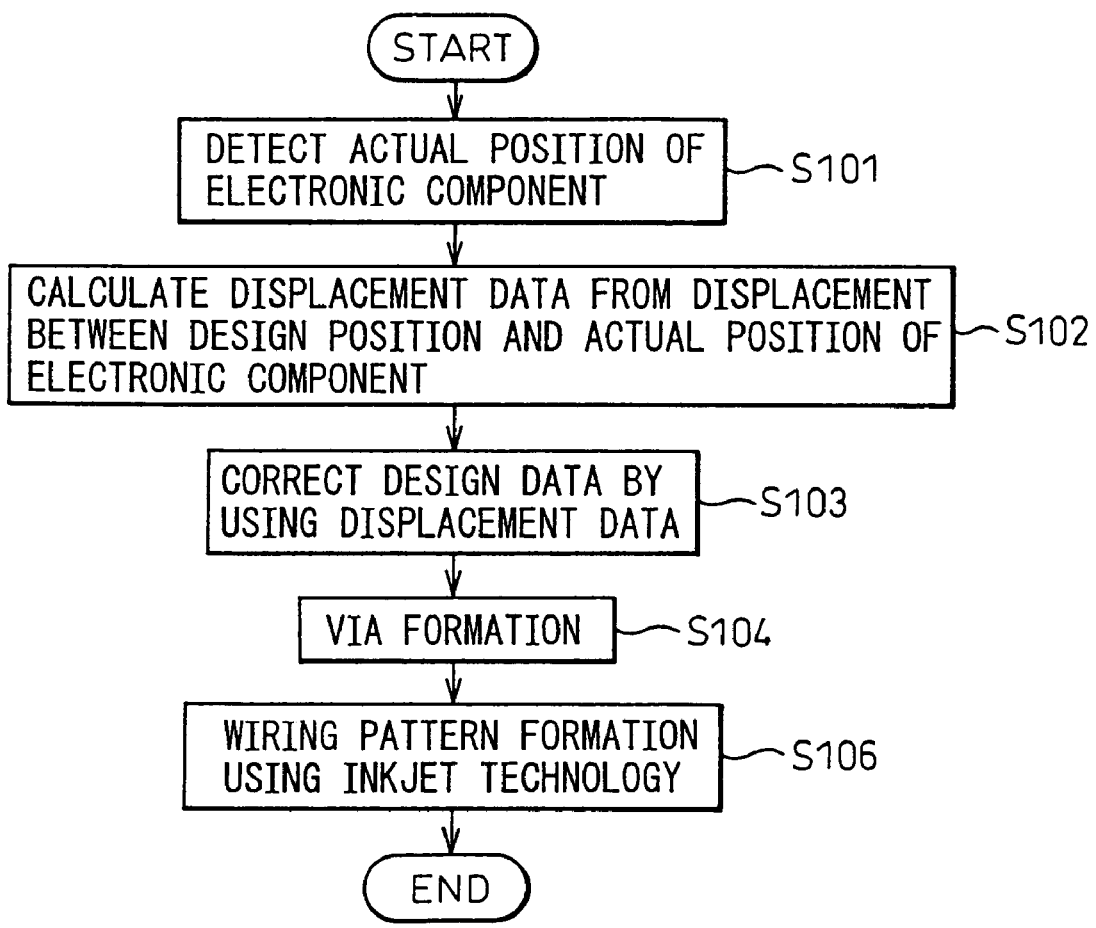
FIG. 3 is a flowchart (part 3) illustrating a component-embedded board fabrication method according to the present invention.
Figure 6A:
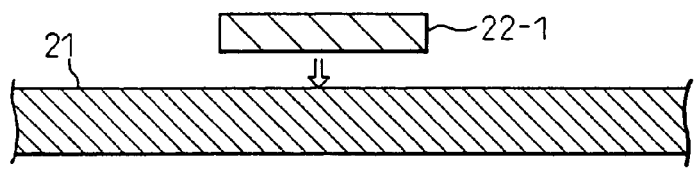
FIGS. 6a to 6e are diagrams (part 1) for explaining a first embodiment of the component-embedded board fabrication method according to the present invention.

First, as shown in FIG. 6a, an electronic component 22-1 is formed by positioning it in accordance with design data on the surface of a board 21 which is not yet covered with an insulating layer.

The board used here is, for example, a glass epoxy board, and the electronic component is, for example, a semiconductor device, a capacitor, a resistor, or the like. In the example shown in FIG. 6a, the electronic component 22-1 is mounted and formed as a discrete component on the bare board surface, but a passive component (electronic component) such as an inductor, capacitor, or resistor may be formed by fabricating it in integral fashion using a thin-film process such as sputtering or vapor deposition. An example of this will be described later.

Figure 6B:
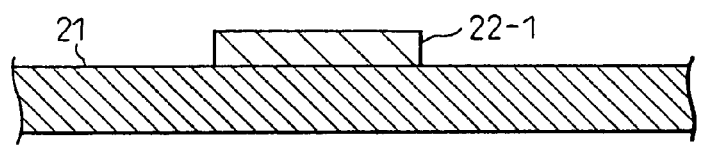

Next, for the board 21 on the surface of which the electronic component 22-1 is formed, as shown in FIG. 6b, the actual position of the electronic component 22-1 on the surface of the board 21 is detected before the surface is covered with an insulating layer. Then, the displacement between the design position of the electronic component 22-1 and the actual position of the electronic component 22-1 formed on the surface of the board 21 is calculated and stored as displacement data. Such displacement data is calculated and stored for each individual electronic component on each individual board. The data structure of the displacement data will be described later.

In the present embodiment, an optical reading device such as a CCD camera (not shown) is used to detect the formed position of the electronic component 22-1. In this case, an image of the surface of the board 21 on which the electronic component 22-1 is formed is captured by the optical reading device. The connecting terminal position of the electronic component 22-1 relative to the reference point on the board 21 is read from the captured image data. Then, the displacement of the actual position of the electronic component 22-1 formed on the surface of the board 21 is calculated relative to the design position of the electronic component 22-1 that can be obtained from the design data. The resulting data is stored as the displacement data in a storage device (not shown) within a component-embedded board fabrication apparatus.

In the present embodiment, the formed position of the electronic component is optically detected, but other methods may be used; for example, the position of the electronic component may be detected using ultrasound, X-rays, or other means.

Furthermore, a maximum value may be predetermined for the displacement data with which the dynamic correction described later can be performed, and provisions may be made to render the board defective if the displacement data exceeds the maximum value. This serves to further increase the fabrication yield, because seriously defective parts that cannot be remedied by the dynamic correction can be completely eliminated.

Figure 6C:
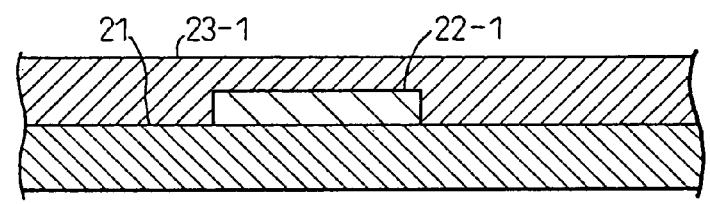

Next, as shown in FIG. 6c, the insulating layer 23-1 is formed in such a manner as to cover the electronic component 22-1, thus burying the electronic component 22-1 in the insulating layer 23-1. A resin such as epoxy, polyimide, or polyphenylene ether may be used to form the insulating layer. The insulating layer 23-1 is formed by applying a coating of such resin material or by depositing a film of such resin material. If, in the process hereinafter described, a via hole is to be formed by exposure to light, a photosensitive insulating resin should be used.

Figure 6D:
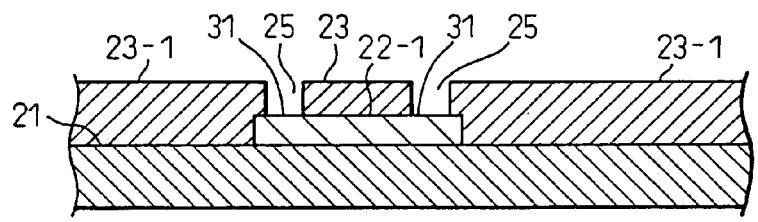

Next, a via hole 25 for forming a via is formed in the insulating layer 23-1, as shown in FIG. 6d. The via hole 25 is formed so as to expose the electrode portion 31 of the electronic component 22-1.

At this stage, the electronic component 22-1 cannot be seen from above as it is already buried in the insulating layer 23-1. In the prior art, the via hole was formed in accordance with the design data, without applying any corrections. Accordingly, in the prior art, when the formed position of the electronic component was displaced for some reason from its design position, if the via hole was formed without applying any corrections to the design data, there were cases where the electrode portion of the electronic component could not be exposed as desired.

On the other hand, according to the present invention, as already explained with reference to FIG. 6b, the displacement data indicating the displacement between the design position of the electronic component 22-1 and the actual position of the electronic component 22-1 formed on the surface of the board 21 is calculated and stored in advance. In the present invention, the position at which to form the via hole 25 is adjusted by dynamically correcting the design data necessary for the formation of the via hole 25 by using the displacement data. Accordingly, if the electronic component 22-1 is displaced from the position specified in the design data, the via hole 25 can be formed by taking the displacement into account, and the electrode portion of the electronic component can thus be exposed reliably.

In practice, a laser method or an exposure method is used to open the via hole 25. In the laser method, the via hole is formed in the insulating layer by using a YAG laser or a $CO_2$ laser. On the other hand, in the exposure method, a photosensitive resin such as a photosensitive polyimide resin is used to form the insulating layer, which is exposed to light and developed to form the via hole.

Figure 6E:
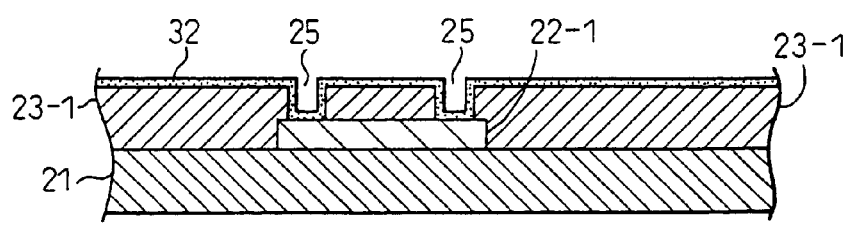

Next, as shown in FIG. 6e, a conductive layer 32 is formed over the surface of the insulating layer 23-1 and the inner wall surface of the via hole 25. This conductive layer 32 acts as a feeder layer when applying electroplating in a subsequent process. The conductive layer 32 is formed, for example, by electroless plating, sputtering, vapor deposition, or the like. In the case of electroless plating, for example, the conductive layer is formed using copper. In the case of sputtering, a chromium layer is formed by sputtering, on top which a copper layer is formed by sputtering to complete the formation of the conductive layer. The chromium layer acts as an adhesion layer between the insulating layer and the copper layer. On the other hand, the copper layer, when used as a feeder layer, has the function of reducing electrical resistance.

Figure 7A:
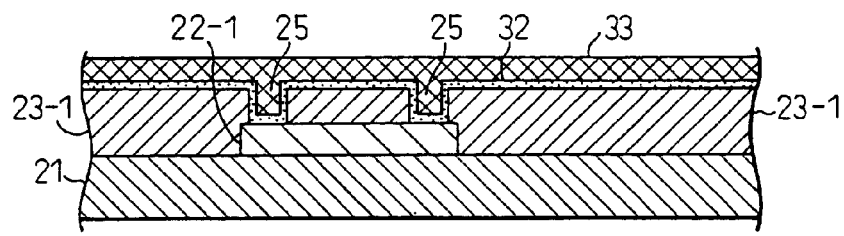
FIGS. 7a to 7d are diagrams (part 2) for explaining the first embodiment of the component-embedded board fabrication method according to the present invention.

Next, a photoresist layer 33 for wiring pattern formation is formed as shown in FIG. 7a. The photoresist layer 33 is formed by applying a photoresist resin coating or by depositing a photoresist resin film. A photoresist type layer is shown here, but a thermosetting resin layer may be used in place of the photoresist layer.

Figure 7B:
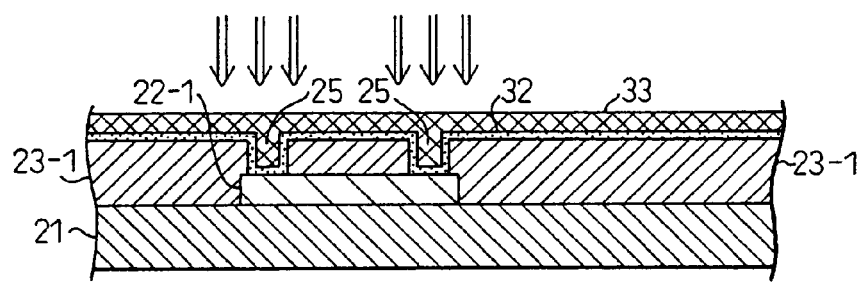

Next, the photoresist layer 33 is exposed to light, as shown in FIG. 7b. Preferably, maskless exposure (direct exposure such as laser or electron beam exposure) is used. The exposed pattern is a positive or negative pattern, depending on whether the photoresist layer 33 is of a positive type or a negative type.

At this stage also, as in the case of FIG. 6d previously shown, the electronic component 22-1 is buried in the insulating layer 23-1 and cannot be seen from above. In the prior art, the exposure was performed by forming a photomask in accordance with the design data, without applying any corrections. Accordingly, in the prior art, when the formed position of the electronic component was displaced for some reason from its design position, the connection or via could not be formed properly to match the position of the connecting terminal of the electronic component.

On the other hand, according to the present invention, as already explained with reference to FIG. 6b, the displacement data indicating the displacement between the design position of the electronic component 22-1 and the actual position of the electronic component 22-1 formed on the surface of the board 21 is calculated and stored in advance. In the present invention, the exposure position is adjusted by dynamically correcting the design data necessary in the maskless exposure by using the displacement data. Accordingly, if the electronic component 22-1 is formed displaced from the position specified in the design data, the connection and the via can be formed by taking the displacement into account. A specific example of the correction algorithm will be described later.

Figure 7C:
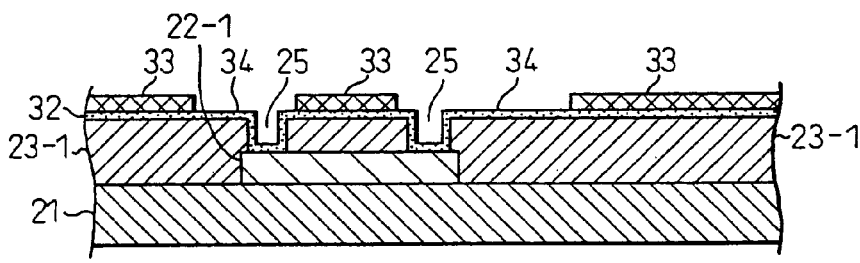

Next, as shown in FIG. 7c, the photoresist layer 33 is developed, and the photoresist layer is removed from the wiring pattern forming portion 34 to expose the underlying conductive layer 32 in that portion.

Figure 7D:
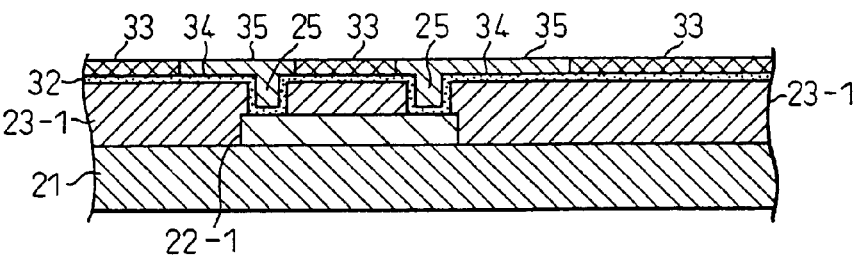

Then, a wiring conductor 35 is formed in the wiring pattern forming portion 34 by electroplating, as shown in FIG. 7d. More specifically, electroplating is applied in such a manner as to fill the via hole 25. The electroplating is applied using the conductive layer 32 as the feeder layer. In this example, copper plating is applied by electroplating, but other plating material may be used.

Figure 8A:
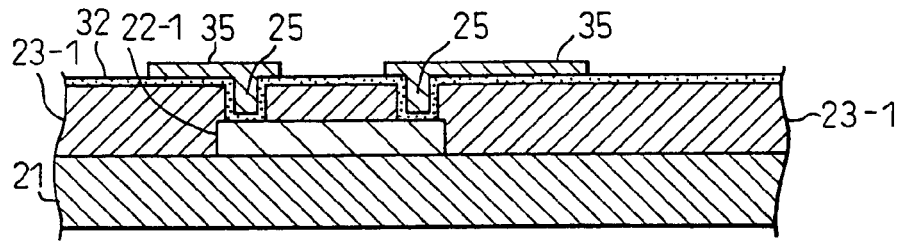
FIGS. 8a to 8d are diagrams (part 3) for explaining the first embodiment of the component-embedded board fabrication method according to the present invention.

Next, the photoresist layer is removed as shown in FIG. 8a.

Figure 8B:
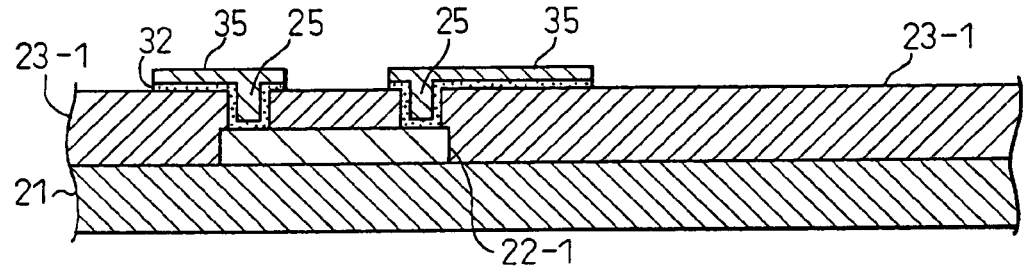

Then, as shown in FIG. 8b, the conductive layer is removed by etching everywhere except at the wiring conductor forming portion, to form the wiring pattern.

This completes the process of embedding (burying) the electronic component in one insulating layer and forming the wiring pattern thereon.

Next, a description will be given of how another layer is formed on top of the above-described layer. The process is basically the same as that described above, and will not be described in detail here, but a brief description will be given below of the case where a passive component such as an inductance, a capacitor or a resistance, as an electronic component to be embedded in an insulating layer, is fabricated in integral fashion using a thin-film process such as sputtering or vapor deposition.

FIGS. 9a and 9b are diagrams illustrating the formation of a capacitor to be embedded in an insulating layer in accordance with the first embodiment of the component-embedded board fabrication method of the present invention.

As shown in FIG. 9a, a lower electrode 36 of the capacitor is formed simultaneously with the formation of a wiring pattern on the underlying insulating layer (or on the board if such an insulating layer is not formed yet). This lower electrode 36 is formed by forming a portion of the wiring pattern as a wide planar portion.

Next, as shown in FIG. 9b, a ferroelectric layer 37 of such material as strontium titanate, barium titanate, or tantalum oxide is formed by sputtering, and on top of that, an upper electrode 38 is formed by copper sputtering or plating. More specifically, the ferroelectric layer 37 and the upper electrode 38 are formed by forming a resist layer. This completes the integral fabrication of the capacitor 39.

As an electronic component, a passive component such as an inductance, a capacitor or a resistance may be embedded in the insulating layer by fabricating it in integral fashion as described above, but the description given hereinafter deals with the case where a discrete electronic component is mounted.

Figure 8C:
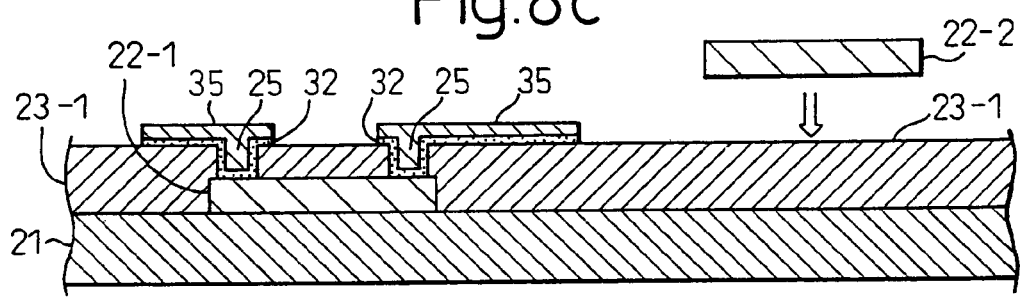

As shown in FIG. 8c, a second electronic component 22-2 is formed is formed by positioning it in accordance with the design data on the surface of the insulating layer 23-1 in which the previously described electronic component is already embedded.

Figure 8D:
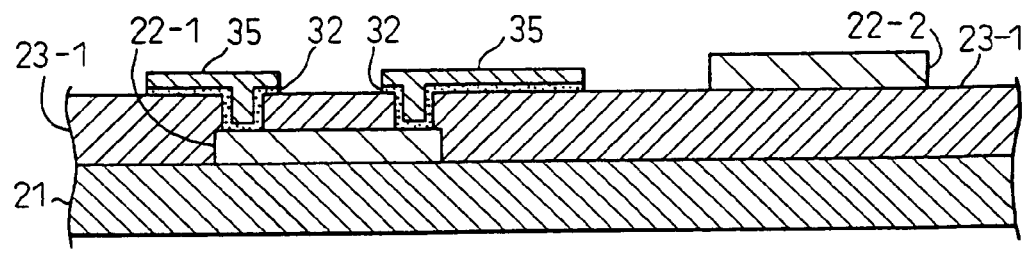

Next, for the insulating layer 23-1 on the surface of which the second electronic component 22-2 is formed, as shown in FIG. 8d, the actual position of the electronic component 22-2 formed on the surface of the insulating layer 23-1 is detected in the same manner as that described with reference to FIG. 6b, before the surface is covered with a second insulating layer. Then, the displacement between the design position of the electronic component 22-2 and the actual position of the electronic component 22-2 formed on the surface of the insulating layer 23-1 is calculated and stored as displacement data.

Figure 10A:
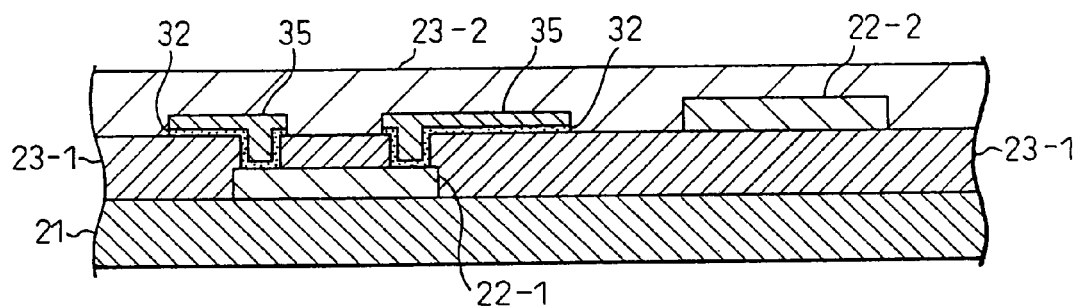
FIGS. 10a and 10b are diagrams (part 4) for explaining the first embodiment of the component-embedded board fabrication method according to the present invention.

Then, as shown in FIG. 10a, the second insulating layer 23-2 is formed over the insulating layer 23-1 in such a manner as to cover the electronic component 22-2, thus burying the electronic component 22-2 in the insulating layer 23-2.

Figure 10B:
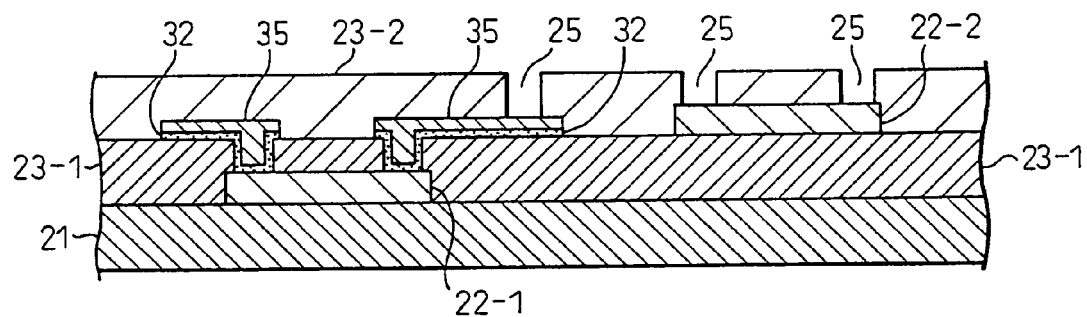
Figure 11A:
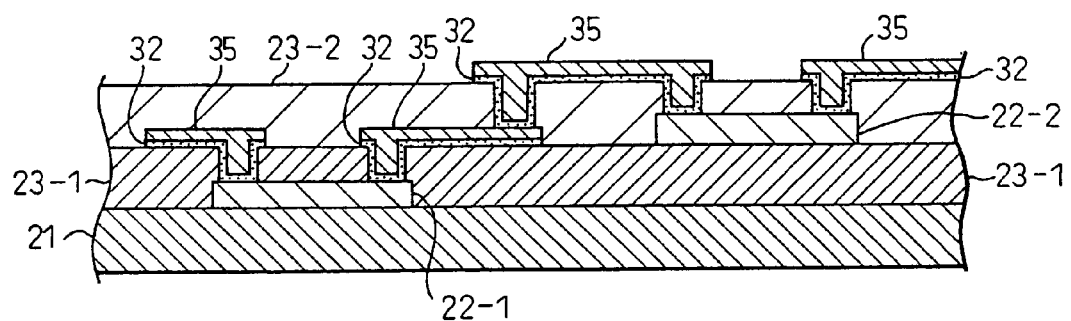
FIGS. 11a and 11b are diagrams (part 5) for explaining the first embodiment of the component-embedded board fabrication method according to the present invention.

Next, a via hole 25 for forming a via is formed in the insulating layer 23-2, as shown in FIG. 10b. Here, as in the case of FIG. 6d, the position at which to form the via hole 25 is adjusted by dynamically correcting the design data necessary for the formation of the via hole 25 by using the displacement data. Thereafter, the formation of a conductive layer 32, the formation of a photoresist layer 33, maskless exposure, etching, and other processing steps are performed in the same manner as previously described, to complete the fabrication of a two-layered component-embedded board such as shown in FIG. 11a.

Figure 11B:
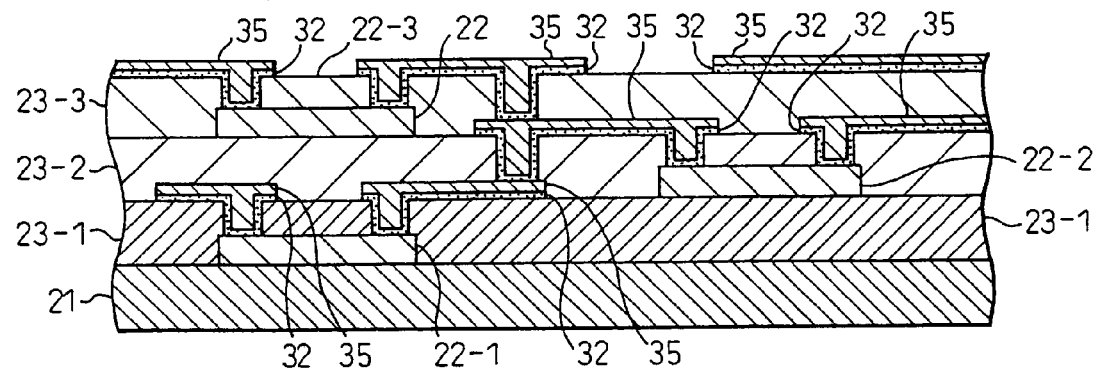

By repeating the above process, a multilayered component-embedded board is fabricated. FIG. 11b is a cross-sectional view illustrating a three-layered component-embedded board.

A multilayered component-embedded board can be fabricated with high precision as described above. In the above embodiment, a semi-additive method has been used as the wiring pattern forming method, but other forming methods may be used in the present invention; for example, a subtractive method or a full-additive method may be used.

Next, a description will be given of a second embodiment of the present invention applied to the fabrication of a multilayered component-embedded board.

As already explained with reference to FIG. 6b, according to the present invention, the displacement data indicating the displacement between the design position of the electronic component 22-1 and the actual position of the electronic component 22-1 formed on the surface of the board 21 is calculated and stored in advance. In the first embodiment of the invention described above, the design data necessary when performing the maskless exposure is dynamically corrected using the displacement data.

On the other hand, in the second embodiment of the invention, the wiring pattern is directly formed (patterned) by using inkjet technology, not the maskless exposure. Design data necessary for the direct patterning is dynamically corrected using the displacement data in the same manner as previously described. That is, the wiring pattern formation using inkjet technology is performed by taking into account the displacement of the electronic component 22-1 from the design data. A specific example of the correction algorithm will be described later.

Inkjet technology is a technology that ejects liquid droplets through nozzles in which microscopic holes are opened. Generally, inkjet technology is used for printers, but when applying inkjet technology directly for the formation of wiring patterns as in the present embodiment, the liquid droplets to be ejected from the nozzles should be formed from a liquid containing fine metal particles or from a metal oxide material. There are two main types of inkjet printing: one is the piezoelectric type that utilizes a piezoelectric element which, when a voltage is applied, is caused to deform, causing a sudden increase in the liquid pressure in the ink chamber and thereby forcing a liquid droplet through the nozzle, and the other is the thermal type that forms a bubble in the liquid by a heater mounted on the head and thereby pushes out a liquid droplet. Either type can be used in the present invention.

The design data dynamically corrected as described in the first embodiment is converted into input data for use in an inkjet apparatus.

Using inkjet technology, fine wiring lines, for example, with line width of 10 μm or less can be formed by ejecting fine metal particles. This contributes to reducing the semiconductor package size.

Furthermore, since various materials can be sprayed onto the board, devices having such functions as a capacitor, resistor, or inductor can be formed on the board as desired. For example, when forming wiring lines, a liquid containing fine metal particles is used, and when forming a capacitor, a metal oxide material is formed by using inkjet technology; in this way, the material to be ejected should be selected according to the element to be formed. Moreover, the smaller the size of the material to be ejected is made, the more stable can be made the amount of metal particles to be ejected by the inkjet apparatus; this serves to reduce variations in the resistance of the wiring lines formed.

FIGS. 12a to 13b are diagrams for explaining the second embodiment of the component-embedded board fabrication method according to the present invention.

Figure 12A:
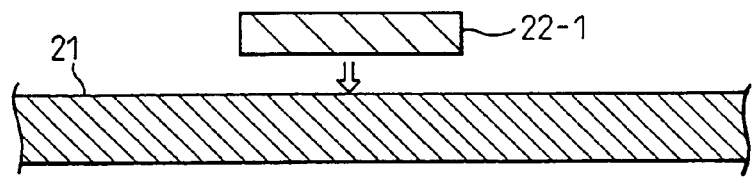
FIGS. 12a to 12d are diagrams (part 1) for explaining a second embodiment of the component-embedded board fabrication method according to the present invention.

First, as shown in FIG. 12a, an electronic component 22-1 is formed by positioning it in accordance with design data on the surface of a board 21 which is not yet covered with an insulating layer, or on the surface of an underlying insulating layer. The electronic component to be formed here is, for example, a semiconductor device, a capacitor, a resistor, or the like. In the example shown in FIG. 12a, the electronic component 22-1 is mounted and formed as a discrete component on the board surface but, alternatively, a device having a function as a capacitor, resistor, inductor, or the like may be formed in an integral fashion on the board by inkjetting the desired material onto the board. The insulating layer can be formed by depositing an insulating resin film or by applying an insulating resin coating.

Figure 12B:
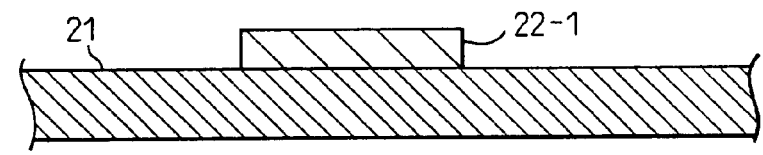

Next, as shown in FIG. 12b, for the board 21 on the surface of which the electronic component 22-1 is formed, the actual position of the electronic component 22-1 formed on the surface of the board 21 is detected. Then, the displacement between the design position of the electronic component 22-1 and the actual position of the electronic component 22-1 formed on the surface of the board 21 is calculated and stored as displacement data. Such displacement data is calculated and stored for each individual electronic component on each individual board.

In the present embodiment, as in the foregoing first embodiment, an optical reading device such as a CCD camera (not shown) is used to detect the formed position of the electronic component 22-1. In this case, an image of the surface of the board 21 on which the electronic component 22-1 is formed is captured by the optical reading device. The connecting terminal position of the electronic component 22-1 relative to the reference point on the board 21 is read from the captured image data. Then, the displacement of the actual position of the electronic component 22-1 formed on the surface of the board 21 is calculated relative to the design position of the electronic component 22-1 that can be obtained from the design data. The resulting data is stored as the displacement data in a storage device (not shown) within the component-embedded board fabrication apparatus. The modifications described in the foregoing first embodiment also apply here.

Figure 12C:
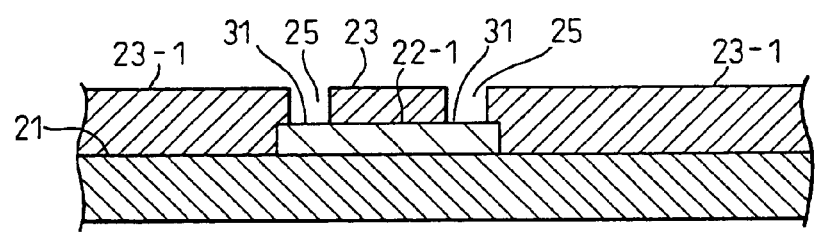

Next, as shown in FIG. 12c, a via hole 25 for forming a via is formed in the insulating layer 23-1. In the present embodiment, the insulating layer is formed in the same manner as in the foregoing first embodiment, after which the via hole is formed by laser machining. As an alternative method of forming the via hole, an insulating resin may be applied by an inkjet apparatus in such a manner as to avoid the position where the via hole is to be formed. According to this method, the via hole can be formed simultaneously with the formation of the insulating layer.

In the present embodiment, an opening is formed, using, for example, a laser, in such a manner as to expose the electrode portion 31 of the electronic component 22-1, as shown in FIG. 12c. As, in the present embodiment, the displacement data indicating the displacement between the design position of the electronic component 22-1 and the actual position of the electronic component 22-1 formed on the surface of the board 21 is calculated and stored in advance, the position at which to form the via hole 25 is adjusted by dynamically correcting the design data necessary for the formation of the via hole 25 by using the displacement data. Accordingly, if the electronic component 22-1 is displaced from the position specified in the design data, the via hole 25 can be formed by taking the displacement into account, and the electrode portion of the electronic component can thus be exposed reliably.

Figure 12D:
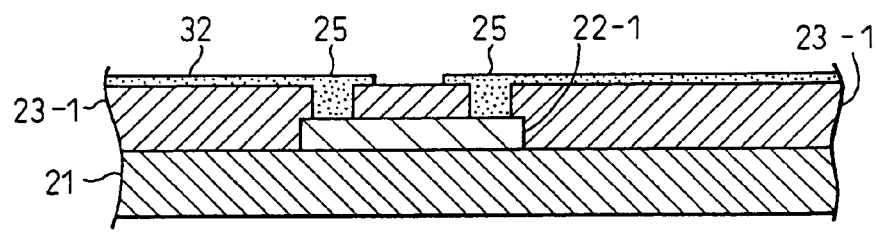

Next, fine metal particles are applied by the inkjet apparatus to form the wiring pattern 32, as shown in FIG. 12d. Here, as the displacement data indicating the displacement between the design position of the electronic component 22-1 and the actual position of the electronic component 22-1 formed on the surface of the board 21 is calculated and stored in advance, the design data necessary when performing the inkjetting is dynamically corrected using the displacement data. As a result, if the electronic component 22-1 is formed displaced from the position specified in design data, the wiring pattern 32 can be formed by taking the displacement into account.

This completes the process of embedding (burying) the electronic component in one insulating layer and forming the wiring pattern thereon.

Next, a description will be given with reference to FIGS. 13a and 13b for the case where a capacitor as a passive component is fabricated as an electronic component in integral fashion within the board.

Figure 13A:
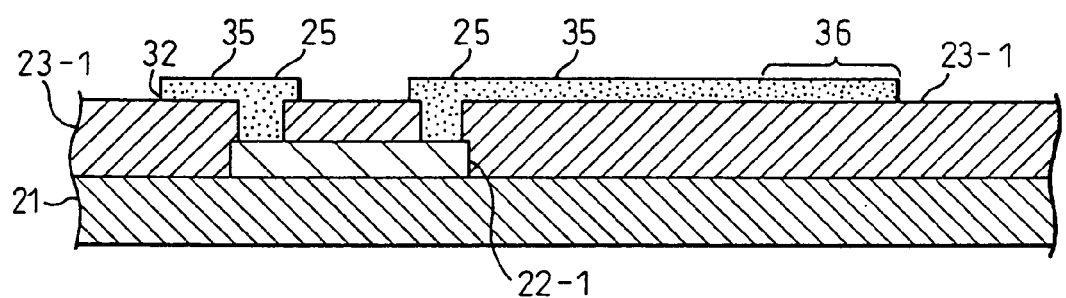
FIGS. 13a and 13b are diagrams (part 2) for explaining the second embodiment of the component-embedded board fabrication method according to the present invention.

As shown in FIG. 13a, a wiring pattern 35 including a portion that serves as a lower electrode 36 of the passive component is formed using the inkjet apparatus.

Figure 13B:
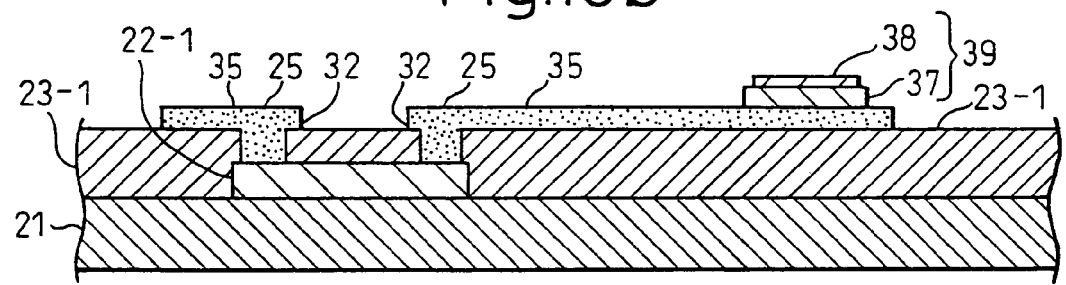

Next, as shown in FIG. 13b, ferroelectric particles made of such material as strontium titanate, barium titanate, or tantalum oxide are applied by the inkjet apparatus to form a ferroelectric layer 37. Then, copper is applied by the inkjet apparatus to form an upper electrode 38. This completes the integral fabrication of the capacitor 39.

In this way, according to the second embodiment of the present invention, since the wiring lines and passive components can be formed directly on the board by using inkjet technology, it becomes easier to fabricate necessary products when necessary in just necessary quantities.

Furthermore, as the wiring can be formed without using lithography or etching steps, the time required to fabricate the circuit board can be drastically reduced. Further, as the specification of the circuit board can be changed easily, the time and cost required to modify the circuit board to be fabricated can also be reduced drastically. Moreover, the time required to fabricate passive components can be saved because portions of the passive components can be formed simultaneously with the formation of the wiring pattern. It is also easy to build a trial product upon completing the design work. Furthermore, any changes to the specification of the circuit board, for example, can be easily implemented without stopping the production line and without separately preparing passive components.

Next, a specific example of the correction algorithm for the design data described in connection with the first and second embodiments will be described below.

The following description deals with the dynamic correction of the design data used in the maskless exposure explained in the first embodiment, but the principle is the same for the dynamic correction of the design data used in the via formation as well as for the wiring pattern formation using inkjet technology explained in the second embodiment. In the case of the wiring pattern formation using inkjet technology, "exposure area EA" in the following description should be replaced by "area where the wiring pattern is formed".

Figure 14:
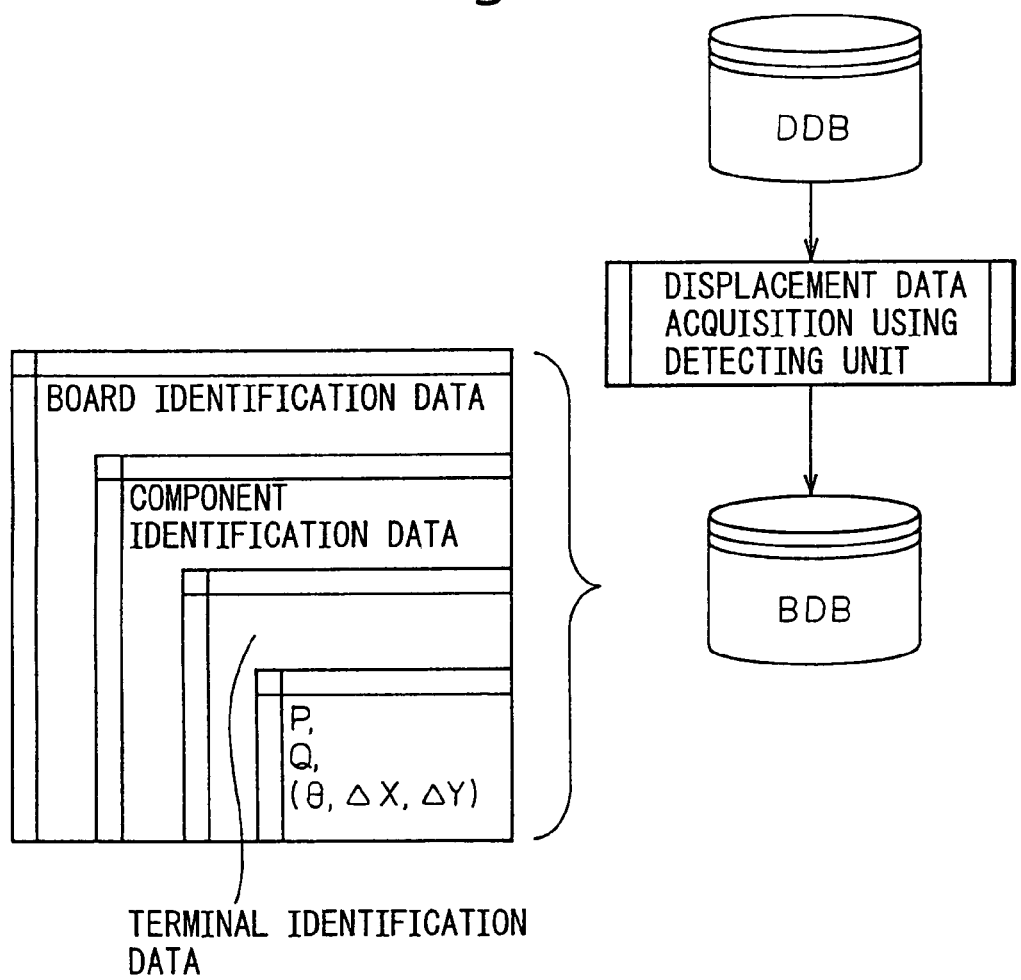
FIG. 14 is a diagram for explaining the data base structure of displacement data.

FIG. 14 is a diagram for explaining the data base structure of the displacement data.

EA designates the exposure area, DDB is a data base in which the design data is stored, and BDB is a data base in which the displacement data, i.e., information indicating the displacement from the design data, is stored.

Board identification data is data relating to board identification information that indicates the sequence number of the board.

Component identification data is data relating to electronic component identification information that indicates the kind of the electronic component, the position of the electronic component formed on the board, etc.

Terminal identification data is data that indicates the applicable terminal of the electronic component.

Further, P, Q, θ, Δx, and Δy are data relating to various geometrical information concerning the terminal of the electronic component. P is a graphical object indicating the design position and shape of the terminal of the electronic component. Q is a graphical object indicating the position and shape of the terminal of the actually formed electronic component that are detected by the detecting means. θ is data relating to the amount of angular displacement of the actually formed electronic component. Δx is data relating to the amount of displacement in x direction of the actually formed electronic component. Δy is data relating to the amount of displacement in y direction of the actually formed electronic component.

From the above data, the relation "there exists (θ, Δx, Δy) that satisfies Q=P(θ, Δx, Δy)" holds. In other words, when θ, Δx, and Δy are given to P, Q is obtained.

If L denotes a graphical object of a connection line then ls denotes an end point of L at the non-terminal side of the electronic component and lt denotes an end point of L at the terminal side of the electronic component. That is, L is used as a connection line from the end point ls at the non-terminal side of the electronic component to the end point lt at the terminal side thereof.

A set of L's intersecting with P is denoted as S(P). That is, S(P)={Li, . . . , Lj}. Further, a set of L's intersecting with Q is denoted as U(Q). That is, U(Q)={Li, . . . , Lj}. Here, i and j are integers.

If a set of P's are denoted by {P}, a set of Q's are denoted by {Q}, and a set of L's are denoted by {L} and φ denotes an empty set.

Figure 15:
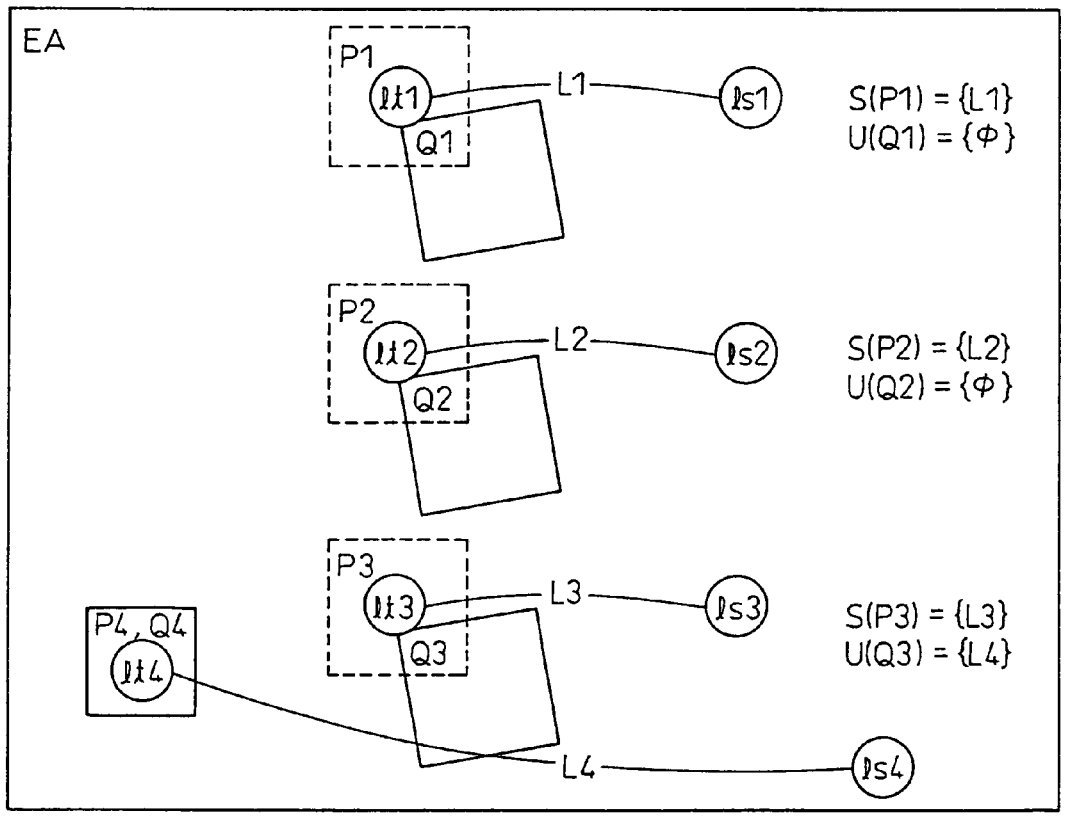
FIG. 15 is a diagram illustrating the positional relationships between the terminals and wiring lines of electronic components before corrections are applied.
Figure 16:
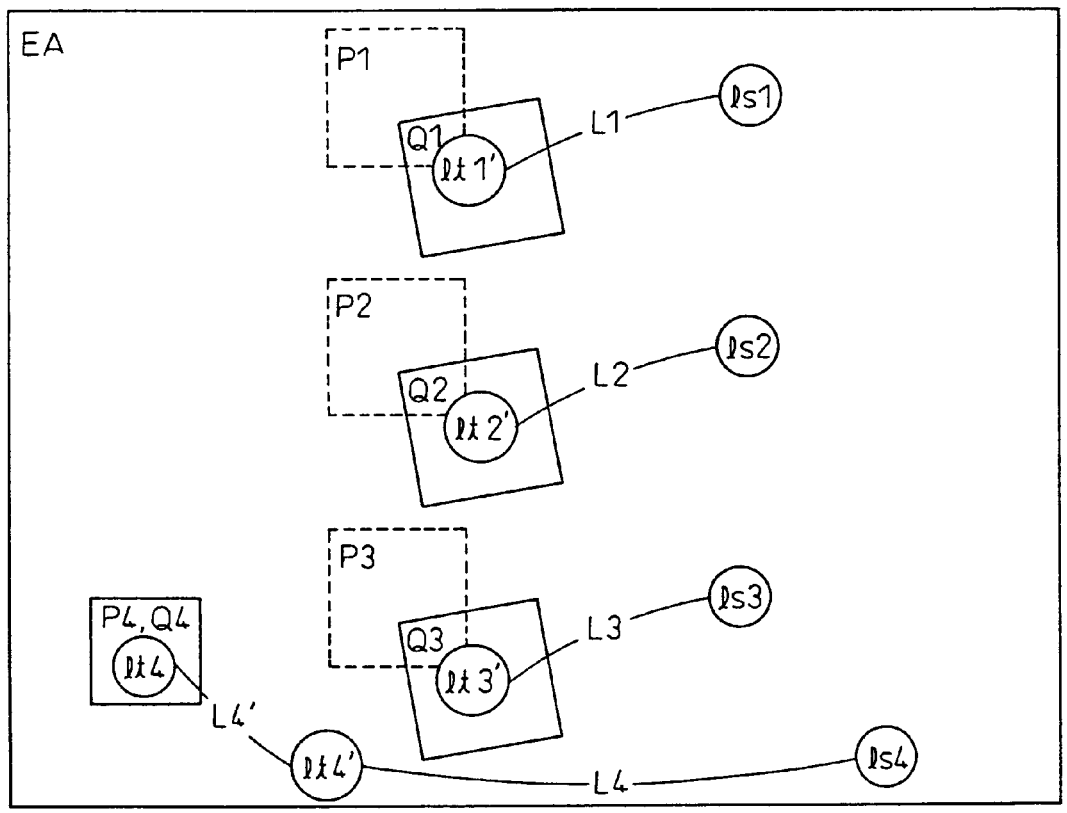
FIG. 16 is a diagram illustrating the positional relationships shown in FIG. 15 after corrections are applied.

FIG. 15 is a diagram illustrating the positional relationships between the terminals and wiring lines of electronic components before corrections are applied, and FIG. 16 is a diagram illustrating the positional relationships shown in FIG. 15 after corrections are applied.

In FIG. 15, the terminal positions of the electronic components as specified in the design data are indicated by P1, P2, P3, and P4, and the positions where the terminals of the electronic components are actually formed are indicated by Q1, Q2, Q3, and Q4. Further, the connection lines as specified in the design data are indicated by L1, L2, L3, and L4, the end points of the L's at the electronic component terminal side are indicated by lt1, lt2, lt3, and lt4, and the end points of the L's at the non-terminal side are indicated by ls1, ls2, ls3, and ls4.

It is assumed here that, according to the design data, the end point ls1 is connected by L1 to the end point lt1 located in the electronic component terminal position P1, the end point ls2 is connected by L2 to the end point lt2 located in the electronic component terminal position P2, the end point ls3 is connected by L3 to the end point lt3 located in the electronic component terminal position P3, and the end point ls4 is connected by L4 to the end point lt4 located in the electronic component terminal position P4, in the exposure area EA, by maskless exposure.

In FIG. 15, it is assumed that, when the electronic components were formed on the surface of the board, the electronic component terminal positions Q1, Q2, and Q3 are displaced from the respective design positions P1, P2, and P3. It is also assumed that no displacement is caused in the position of the electronic component terminal P4.

If the maskless exposure is performed using the design data without applying any corrections despite the displacements caused in the formation of the electronic components, the design position and the actual position of each electronic component terminal will have the following positional relationship with respect to the wiring line to be connected.

First, as shown in FIG. 15, for L1, the end point lt1 in the design data is formed in the design terminal position P1 of the electronic component, and is thus located outside the position Q1 where the electronic component terminal is actually formed. That is, S(P1)={L1} and U(Q1)={φ}.

Next, for L2, the end point lt2 in the design data is formed in the design terminal position P2 of the electronic component, and is thus located outside the position Q2 where the electronic component terminal is actually formed. That is, S(P2)={L2} and U(Q2)={φ}.

Further, for L3, the end point lt3 in the design data is formed in the design terminal position P3 of the electronic component, and is thus located outside the position Q3 where the electronic component terminal is actually formed. Further, Q3 intersects with L4; as a result, S(P3)={L3} and U(Q3)={L4}.

On the other hand, for L4, as the design terminal position P4 of the electronic component coincides with the position Q4 where the terminal is actually formed, the end point lt4 in the design data is formed in the position where the electronic component is actually formed. However, the line L4 intersects with the position Q3 where another electronic component is actually formed. That is, S(P4)={L4} and U(Q4)={L4}.

In this way, when the exposure is performed using the design data without applying any corrections, if the terminal position of the actually formed electronic component is displaced from the position specified in the design data, an error, such as the wiring line failing to be connected to the electronic component terminal as specified in the design drawing or the wiring line being formed intersecting with the terminal position of another electronic component, occurs.

In view of this, in the present invention, as previously described, the design data is dynamically corrected by using the electronic component displacement data (that is, the displacement from the design data) calculated and stored in advance before the board is covered with an insulating layer, and the subsequent processing steps such as the wiring pattern formation and via formation using the maskless exposure or inkjet technology, are carried out using the corrected data.

The correction algorithm is adapted to match the positional displacement condition of the electronic component.

According to the first correction algorithm, when the actual terminal position of the electronic component formed in the exposure area EA is displaced from the position specified in the design data and is thus located outside the position of the end of the wiring line to be connected to the terminal of the electronic component, the design data is corrected so as to move the end lt of the wiring line L to be connected to the terminal of the electronic component to the actual terminal position of the electronic component so that the wiring line can be connected to the terminal of the electronic component as specified in the design drawing. For example, as shown in FIG. 16, end points lt1', lt2', and lt3' are created at the positions where the respective electronic components are actually formed.

According to the second correction algorithm, when the terminal position of the electronic component formed in the exposure area EA is displaced from the position specified in the design data and is intersected with the wiring line used for connection of the terminal of another electronic component, a correction is made by creating a bending point to reroute the wiring line or by increasing or decreasing the line width. For example, as shown in FIG. 16, while leaving the position of lt4 unchanged, a bending point lt4' is created and connected using lines L4 and L4'. In this case, the line width may be adjusted so as to keep the electrical length between ls4 and lt4 as close as possible to the design length.

Alternatively, when an error such as described above has occurred, the maskless exposure or the via formation process itself may be stopped, and provisions may be made to report the occurrence of the error to the production line manager, etc.

The present invention may also be applied to such a case where an urgent change is made to the circuit configuration, for example, during the trial production of the component-embedded board, without changing the design drawing itself.

For example, when the wiring pattern is changed due to a circuit change in the component-embedded board, the wiring may be formed by incorporating the corresponding change.

Further, when a certain electronic component is rendered unnecessary due to a circuit change in the component-embedded board, for example, the wiring may be formed by making a correction so as to eliminate the connection to that electronic component from the wiring pattern.

Furthermore, when a new electronic component (for example, a chip capacitor) is added due to a circuit change in the component-embedded board, for example, the wiring may be formed by making a correction so as to add pads for connection of the new electronic component.

Figure 17:
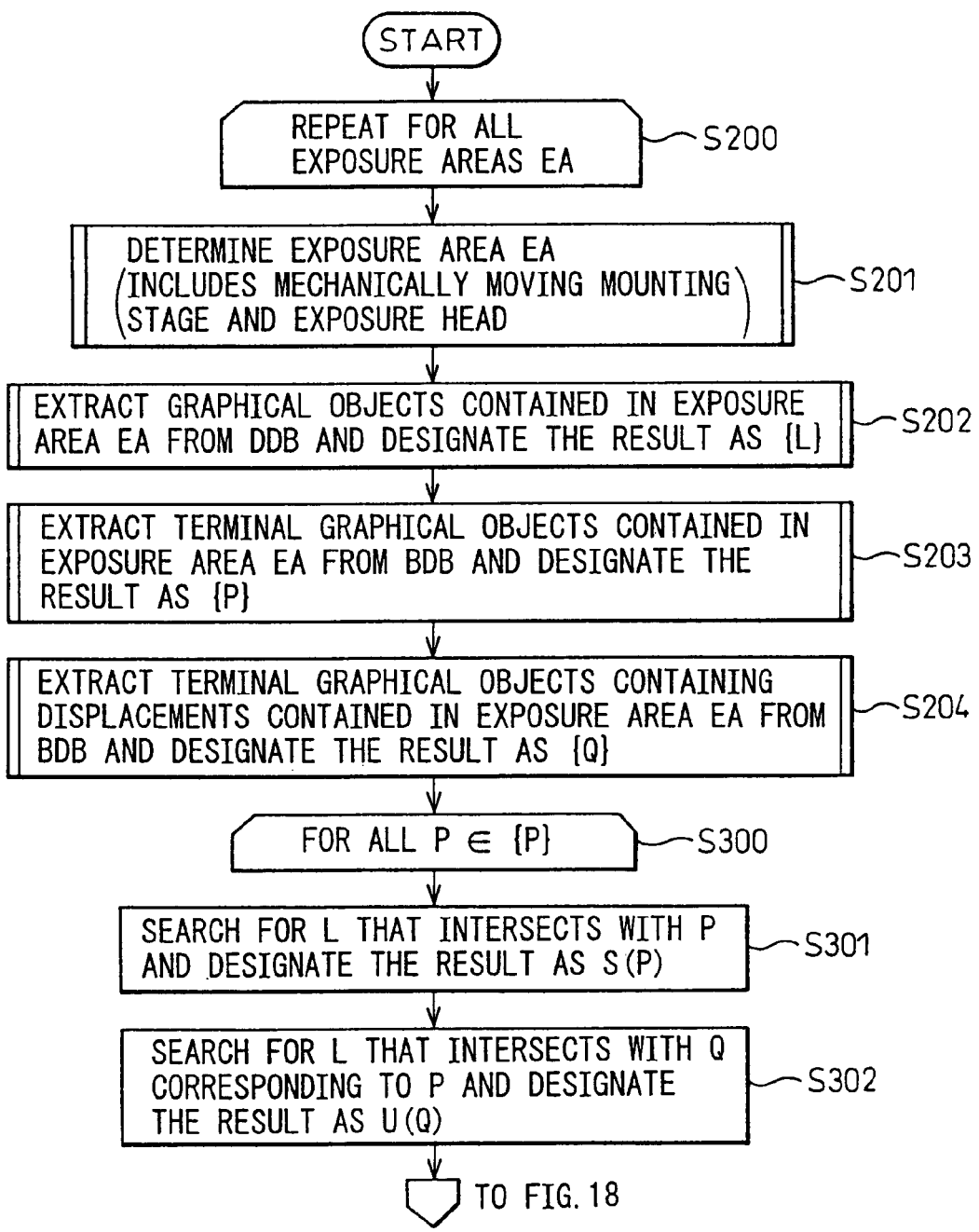
FIG. 17 is a flowchart (part 1) illustrating in detail the flow of a design data correction process.
Figure 18:
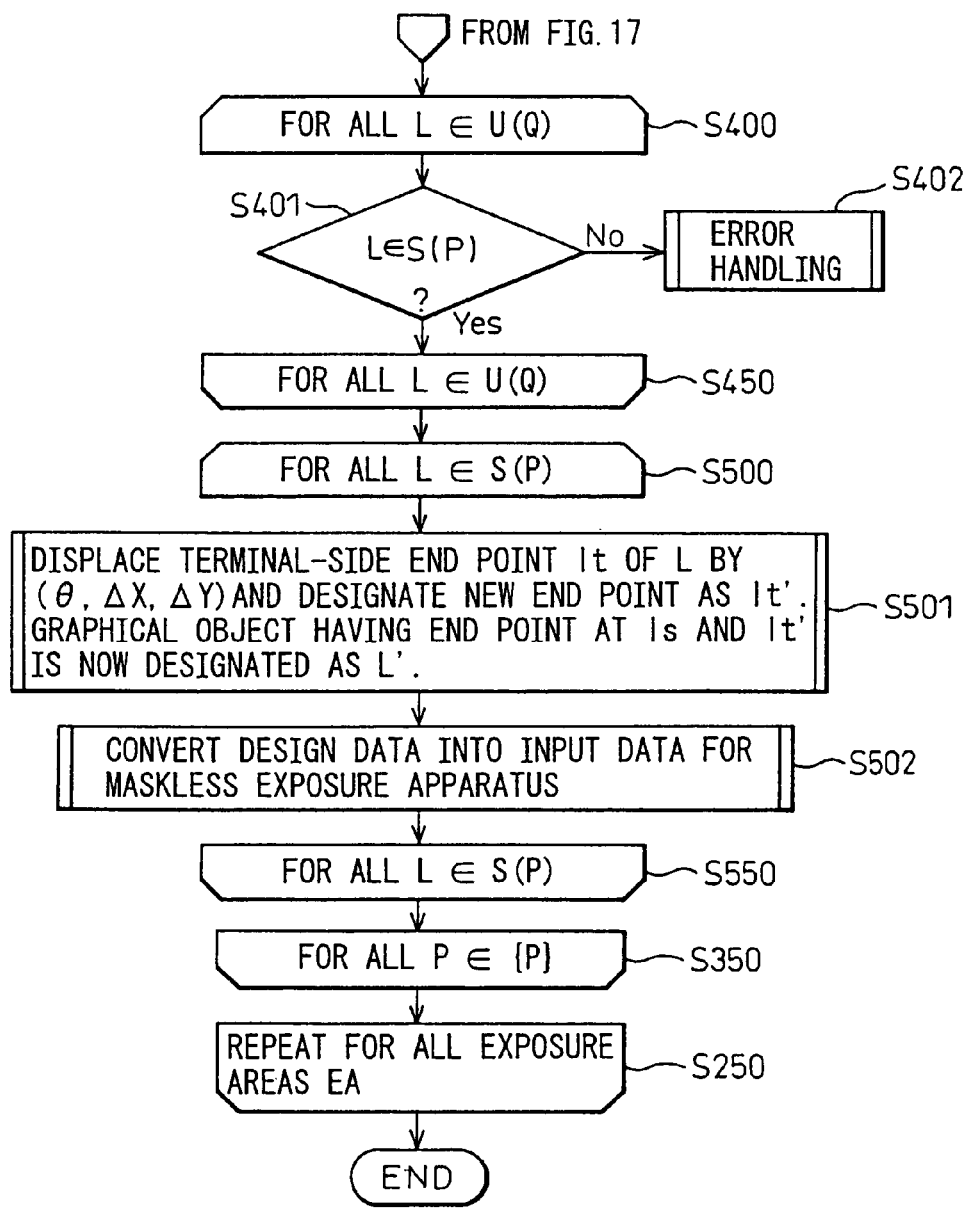
FIG. 18 is a flowchart (part 2) illustrating in detail the flow of the design data correction process.
Figure 19:
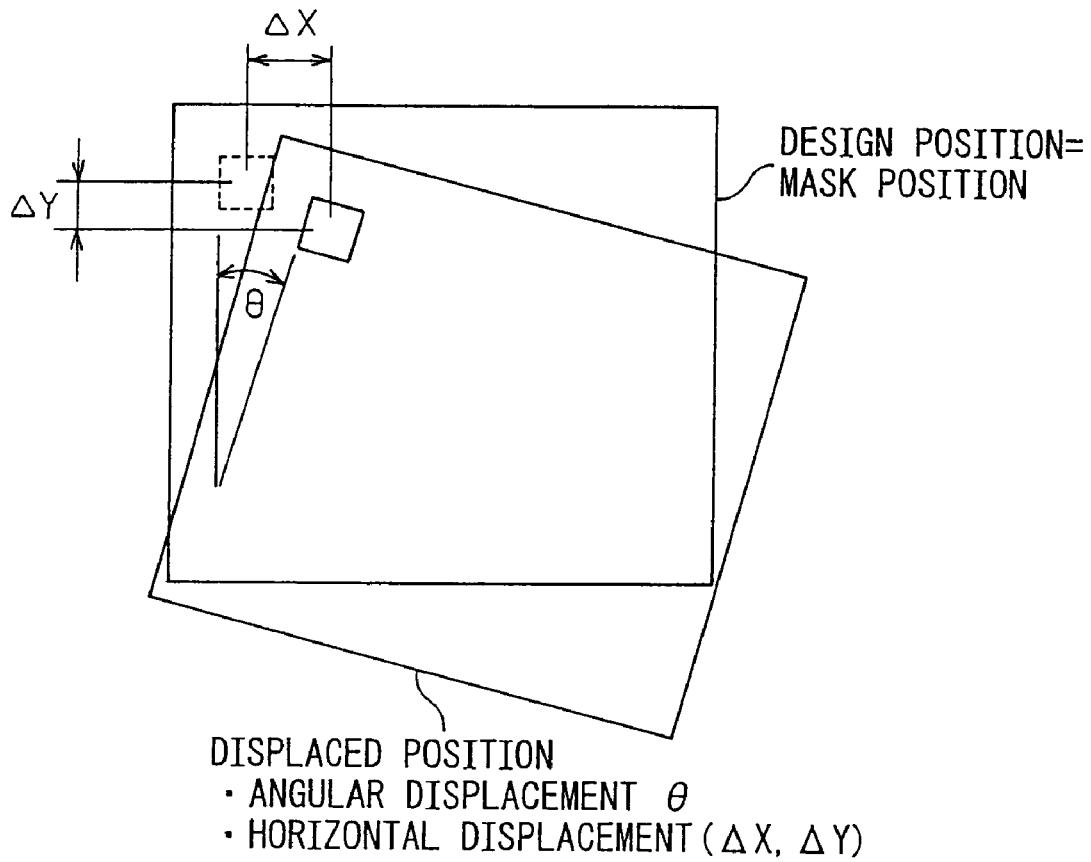
FIG. 19 is a diagram illustrating the patterning and the resulting positional displacement in a prior art example using a photomask.
Figure 20:
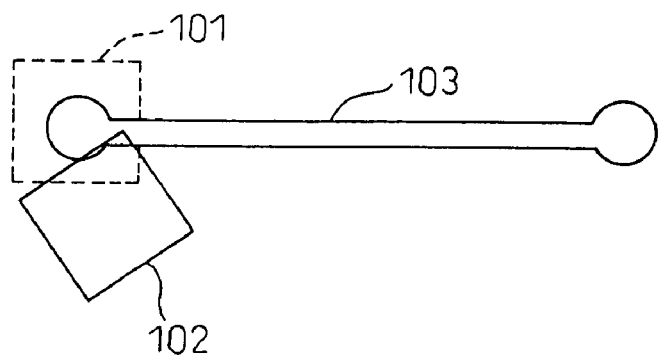
FIG. 20 is a diagram illustrating the positional relationship between an electronic component and a wiring line drawn on a component-embedded board by using a photomask.

FIGS. 17 and 18 are flowcharts illustrating in detail the flow of the design data correction process.

The following description deals with the dynamic correction of the design data used in the maskless exposure explained in the first embodiment, but the principle is the same for the dynamic correction of the design data used in the via formation as well as for the wiring pattern formation using inkjet technology explained in the second embodiment. In the case of the wiring pattern formation using inkjet technology, "exposure area EA" in the following description should be replaced by "area where the wiring pattern is formed".

The design data dynamic correction described hereinafter is repeated for each exposure area EA on each individual board (S200 to S250).

First, in FIG. 17, the exposure area EA is determined in step S201. This step includes mechanically moving the substrate mounting stage and the exposure head prior to the maskless exposure performed on the thus determined exposure area EA.

Next, in step S202, graphical objects representing the lines contained in the exposure area EA are extracted from the data base DDB in which the design data is stored. The extracted result is designated as {L}.

Further, in step S203, graphical objects representing the terminals of the electronic components contained in the exposure area EA are extracted from the data base BDB in which the information indicating the displacement from the design data is stored. The extracted result is designated as {P}.

Next, in step S204, graphical objects containing the displacements of the terminals of the electronic components contained in the exposure area EA are extracted from the data base BDB in which the information indicating the displacement from the design data is stored. The extracted result is designated as {Q}.

Then, for all P ∈ {P} (S300 to S350), a search is made in step S301 for L that intersects with P. The search result is designated as S(P).

Next, in step S302, a search is made for L that intersects with Q corresponding to P. The search result is designated as U{Q}.

Next, for all L ∈ U{Q} (S400 to S450), it is determined in step S401 whether L is contained in S(P). If L is not contained in S(P), this means that an intersection with a wiring line other than the wiring line to be connected to P has been detected; therefore, in step S402, the second correction algorithm explained with reference to FIGS. 15 and 16 is performed, after which the process proceeds to step S502 to be described later. Alternatively, the process itself may stop here.

If L is contained in S(P), then for all L ∈ S{P} (S500 to S550) the first correction algorithm explained with reference to FIGS. 15 and 16 is performed (S501). That is, the end point lt of L at the electronic component terminal side is displaced by (θ, Δx, Δy), and the new end point is designated as lt'. The graphical object having its end points at ls and lt' is now designated as L'.

In step S502, the design data dynamically corrected as described above is converted into input data for the maskless exposure apparatus.

The design data is dynamically corrected as described above, and the thus corrected data is used in the maskless exposure. The same applies to the dynamic correction of the design data used in the via formation or the wiring pattern formation using inkjet technology. For example, in the case of the wiring pattern formation using inkjet technology, the design data dynamically corrected as described above should be converted into input data for the inkjet apparatus.

Each of the above embodiments has been described by dealing with an example in which the present invention is applied to the case where the actually formed or mounted position of the electronic component is displaced from the forming or mounting position specified in the design data. That is, the design data has been corrected by only considering the difference between the actually formed or mounted position of the electronic component and the forming or mounting position specified in the design data. As a modified example of the invention, the design data may be dynamically corrected by taking into account the distortion caused in the board or the electronic component during fabrication. In this case, not only the formed or mounted position of the electronic component but the shape of the formed or mounted electronic component is also measured, and the design data is corrected in accordance with the obtained results.

As described above, according to the present invention, when fabricating a component-embedded board, if the electronic component formed on the board is displaced from the design position thereof, the design data to be used in the subsequent processing of the board is corrected by taking the displacement into account, and the via formation, the maskless exposure, and the wiring pattern formation using inkjet technology are performed based on the corrected design data; as a result, the component-embedded board can be fabricated easily and stably, even if the electronic component is somewhat displaced in position.

Further, according to the present invention, as the design data necessary for the maskless exposure, the via formation, and the wiring pattern formation using inkjet technology can be correctly dynamically for each individual board and for each individual electronic component and each terminal of the electronic component, optimum maskless exposure, optimum via formation, and optimum wiring pattern formation using inkjet technology can always be achieved. In particular, even if the number of layers in the board is increased, or if the wiring line width is reduced, the above processes can be performed with high precision. For example, in the case of a multilayered component-embedded board, if it is desired to place a decoupling capacitor in the layer directly above the power supply line from the standpoint of noise reduction, many benefits can be obtained by applying the present invention.

Furthermore, the fabrication yield drastically improves compared with the prior art example using a photomask, and the production cost can also be reduced because there is no need to produce a photomask.

Moreover, according to the present invention, as the position where the electronic component is actually formed is detected before it is covered with an insulating layer, if provisions are made to render the board defective when the displacement data obtained at this stage exceeds the minimum value of the displacement data with which the dynamic correction can be performed, the fabrication yield can be further increased because seriously defective parts that cannot be remedied by the dynamic correction can be completely eliminated.

What is claimed is:

1. A component-embedded board fabrication method for fabricating a component-embedded board with electronic components, comprising:
    detecting, before a board is covered with a first insulating layer, an actual position of a first electronic component formed on a surface of said board;
    calculating a displacement between a design position of said first electronic component and the actual position of said first electronic component on the surface of said board, and holding said displacement as first displacement data;
    determining whether the first displacement data represents a displacement that exceeds a predetermined maximum value at which the board is rendered defective; and
    correcting, based on said first displacement data, design data to be used for processing said board, covering said board with said first insulating layer to form a wiring pattern connected to said first electrical component, and forming via holes in the first insulating layer in accordance with the corrected design data only when it is determined that the represented displacement does not exceed the predetermined maximum value, wherein
    the correcting the design data includes creating a bending point in a first wiring line used to connect a terminal of the first electronic component in order to move the first wiring line away from at least one second wiring line used to connect a terminal of at least one second electronic component when it is determined that the first wiring line intersects the at least one second wiring line.

2. A component-embedded board fabrication method as claimed in claim 1, further comprising applying, based on said design data corrected in said correcting, a maskless exposure to said board covered with said first insulating layer.

3. A component-embedded board fabrication method as claimed in claim 1, further comprising a first direct patterning step for forming, based on said design data corrected in said first correction step, a wiring pattern by inkjetting on said board covered with said first insulating layer.

4. A component-embedded board fabrication method as claimed in claim 1, further comprising forming, based on said design data corrected in said correcting, a via hole in said board covered with said first insulating layer.

5. A component-embedded board fabrication method as claimed in claim 1, further comprising:
    detecting, before said board is covered with a second insulating layer, the actual position of a second electronic component formed on a surface of said first insulating layer in which said first electronic component is already embedded;

calculating a displacement between the design position of said second electronic component and the actual position of said second electronic component on the surface of said first insulating layer, and holding said displacement as second displacement data; and correcting, based on said second displacement data, design data to be used for processing said board after said board is covered with said second insulating layer.

6. A component-embedded board fabrication method as claimed in claim 5, further comprising applying, based on said design data corrected in said correcting, based on said second displacement data, a maskless exposure to said board covered with said second insulating layer.

7. A component-embedded board fabrication method as claimed in claim 5, further comprising a second direct patterning step for forming, based on said design data corrected in said second correction step, a wiring pattern by inkjetting on said board covered with said second insulating layer.

8. A component-embedded board fabrication method as claimed in claim 5, further comprising forming, based on said design data corrected in said correcting, based on said second displacement data, a via hole in said board covered with said second insulating layer.

9. A component-embedded board fabrication method as claimed in claim 5, wherein when the actual position of a terminal of said formed electronic component is displaced from an end of a wiring line that is defined in said design data as being the end to be connected to the terminal of said electronic component, said correcting, based on said second displacement data, corrects said design data so as to move said end of said wiring line to be connected to the terminal of said electronic component to the actual position of said formed electronic component.

10. A component-embedded board fabrication method as claimed in claim 1, further comprising:

capturing, before said board is covered with a second insulating layer, an image of a surface of said first insulating layer on which a second electronic component is formed and in which said first electronic component is already embedded;

calculating a displacement between the design position of said second electronic component and the actual position of said second electronic component detected from second image data obtained by imaging the surface of said first insulating layer, and holding said displacement as second displacement data; and correcting, based on said second displacement data, design data to be used for processing said board after said board is covered with said second insulating layer.

11. A component-embedded board fabrication method as claimed in claim 10, further comprising applying, based on said design data corrected in said correcting, based on said second displacement data, a maskless exposure to said board covered with said second insulating layer.

12. A component-embedded board fabrication method as claimed in claim 10, further comprising a second direct patterning step for forming, based on said design data corrected in said second correction step, a wiring pattern by inkjetting on said board covered with said second insulating layer.

13. A component-embedded board fabrication method as claimed in claim 10, further comprising forming, based on said design data corrected in said correcting, based on said second displacement data, a via hole in said board covered with said second insulating layer.

14. A component-embedded board fabrication method as claimed in claim 10, wherein when the actual position of a terminal of said formed electronic component is displaced from an end of a wiring line that is defined in said design data as being the end to be connected to the terminal of said electronic component, said correcting, based on said second displacement data, corrects said design data so as to move said end of said wiring line to be connected to the terminal of said electronic component to the actual position of said formed electronic component.

15. A component-embedded board fabrication method as claimed in claim 1, wherein when the actual position of a terminal of said formed electronic component is displaced from an end of a wiring line that is defined in said design data as being the end to be connected to the terminal of said electronic component, said correcting corrects said design data so as to move said end of said wiring line to be connected to the terminal of said electronic component to the actual position of said formed electronic component.

16. The component-embedded board fabrication method of claim 1, wherein in said detecting, an optical reading device captures an image of the component-embedded board and detects the actual position of the first electronic component based on the image.

17. A component-embedded board fabrication method for fabricating a component-embedded board with electronic components, comprising:

capturing, before a board is covered with a first insulating layer, an image of a surface of said board on which a first electronic component is formed;

calculating a displacement between a design position of said first electronic component and an actual position of said first electronic component detected from first image data obtained by imaging the surface of said board, and holding said displacement as first displacement data;

determining whether the first displacement data represents a displacement that exceeds a predetermined maximum value at which the wiring board is rendered defective; and correcting, based on said first displacement data, design data to be used for processing said board, covering said board with said first insulating layer to form a wiring pattern connected to said first electrical component, and forming via holes in the first insulating layer in accordance with the corrected design data only when it is determined that the represented displacement does not exceed the predetermined maximum value, wherein the correcting the design data includes creating a bending point in a first wiring line used to connect a terminal of the first electronic component in order to move the first wiring line away from at least one second wiring line used to connect a terminal of at least one second electronic component when it is determined that the first wiring line intersects the at least one second wiring line.

18. A component-embedded board fabrication method as claimed in claim 17, further comprising applying, based on said design data corrected in said correcting, a maskless exposure to said board covered with said first insulating layer.

19. A component-embedded board fabrication method as claimed in claim 17, further comprising a first direct patterning step for forming, based on said design data corrected in said first correction step, a wiring pattern by inkjetting on said board covered with said first insulating layer.

20. A component-embedded board fabrication method as claimed in claim 17, further comprising forming, based on said design data corrected in said correcting, a via hole in said board covered with said first insulating layer.

21. A component-embedded board fabrication method as claimed in claim 17, further comprising:
   detecting, before said board is covered with a second insulating layer, the actual position of a second electronic component formed on a surface of said first insulating layer in which said first electronic component is already embedded;
   calculating a displacement between the design position of said second electronic component and the actual position of said second electronic component on the surface of said first insulating layer, and holding said displacement as second displacement data; and
   correcting, based on said second displacement data, design data to be used for processing said board after said board is covered with said second insulating layer.

22. A component-embedded board fabrication method as claimed in claim 21, further comprising applying, based on said design data corrected in said correcting, based on said second displacement data, a maskless exposure to said board covered with said second insulating layer.

23. A component-embedded board fabrication method as claimed in claim 21, further comprising a second direct patterning step for forming, based on said design data corrected in said second correction step, a wiring pattern by inkjetting on said board covered with said second insulating layer.

24. A component-embedded board fabrication method as claimed in claim 21, further comprising forming, based on said design data corrected in said correcting, based on said second displacement data, a via hole in said board covered with said second insulating layer.

25. A component-embedded board fabrication method as claimed in claim 17, wherein when the actual position of a terminal of said formed electronic component is displaced from an end of a wiring line that is defined in said design data as being the end to be connected to the terminal of said electronic component, said correcting corrects said design data so as to move said end of said wiring line to be connected to the terminal of said electronic component to the actual position of said formed electronic component.

26. A component-embedded board fabrication method as claimed in claim 21 wherein, when the actual position of a terminal of said formed electronic component is displaced from an end of a wiring line that is defined in said design data as being the end to be connected to the terminal of said electronic component, said correcting, based on said second displacement data, corrects said design data so as to move said end of said wiring line to be connected to the terminal of said electronic component to the actual position of said formed electronic component.

27. A component-embedded board fabrication method as claimed in claim 17, further comprising:
   capturing, before said board is covered with a second insulating layer, an image of a surface of said first insulating layer on which a second electronic component is formed and in which said first electronic component is already embedded;
   calculating a displacement between the design position of said second electronic component and the actual position of said second electronic component detected from second image data obtained by imaging the surface of said first insulating layer, and holding said displacement as second displacement data; and
   correcting, based on said second displacement data, design data to be used for processing said board after said board is covered with said second insulating layer.

28. A component-embedded board fabrication method as claimed in claim 27, further comprising applying, based on said design data corrected in said correcting, based on said second displacement data, a maskless exposure to said board covered with said second insulating layer.

29. A component-embedded board fabrication method as claimed in claim 27, further comprising a second direct patterning step for forming, based on said design data corrected in said second correction step, a wiring pattern by inkjetting on said board covered with said second insulating layer.

30. A component-embedded board fabrication method as claimed in claim 27, further comprising forming, based on said design data corrected in said correcting, based on said second displacement data, a via hole in said board covered with said second insulating layer.

31. A component-embedded board fabrication method as claimed in claim 27 wherein, when the actual position of a terminal of said formed electronic component is displaced from an end of a wiring line that is defined in said design data as being the end to be connected to the terminal of said electronic component, said correcting, based on said second displacement data, corrects said design data so as to move said end of said wiring line to be connected to the terminal of said electronic component to the actual position of said formed electronic component.

32. An apparatus for fabricating a component-embedded board with electronic components, comprising:
   means for detecting, before a board is covered with a first insulating layer, an actual position of a first electronic component formed on a surface of said board;
   means for calculating a displacement between a design position of said first electronic component and the actual position of said first electronic component on the surface of said board, and holding said displacement as first displacement data;
   means for determining whether the first displacement data represents a displacement that exceeds a predetermined maximum value at which the board is rendered defective; and
   means for correcting, based on said first displacement data, design data to be used for processing said board, covering said board with said first insulating layer to form a wiring pattern connected to said first electrical component, and forming via holes in the first insulating layer in accordance with the corrected design data, only when it is determined that the represented displacement does not exceed the predetermined maximum value, wherein
   the correcting the design data includes creating a bending point in a first wiring line used to connect a terminal of the first electronic component in order to move the first wiring line away from at least one second wiring line used to connect a terminal of at least one second electronic component when it is determined that the first wiring line intersects the at least one second wiring line.

* * * * *